(12) United States Patent
Schneider

(10) Patent No.: US 10,103,729 B2
(45) Date of Patent: Oct. 16, 2018

(54) AUXILIARY COMMUTATED SILICON-CONTROLLED RECTIFIER CIRCUIT METHODS AND SYSTEMS

(71) Applicant: ROCKWELL AUTOMATION TECHNOLOGIES, INC., Mayfield Heights, OH (US)

(72) Inventor: Robert S. Schneider, Middleton, WI (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 94 days.

(21) Appl. No.: 15/278,979

(22) Filed: Sep. 28, 2016

(65) Prior Publication Data

US 2018/0091137 A1 Mar. 29, 2018

(51) Int. Cl.
*H03K 17/687* (2006.01)
*H03K 17/56* (2006.01)
*H03K 17/567* (2006.01)
*H02M 7/515* (2007.01)

(52) U.S. Cl.
CPC ............ *H03K 17/56* (2013.01); *H02M 7/515* (2013.01); *H03K 17/567* (2013.01)

(58) Field of Classification Search
CPC .... H03K 17/725; H03K 29/00; H03K 17/105; H03K 17/08144; H03K 17/136; H03K 17/567; H03K 17/04123; H03K 17/72; G05D 22/02
USPC .................. 327/428, 445, 453, 582
See application file for complete search history.

(56) References Cited

U.S. PATENT DOCUMENTS

| | | | |
|---|---|---|---|
| 3,431,436 A | | 3/1969 | King |
| 3,548,216 A | | 12/1970 | Burch |
| 3,763,418 A | * | 10/1973 | Beck ............... H02M 3/135 363/124 |
| 3,931,563 A | | 1/1976 | Stacey |
| 4,107,551 A | | 8/1978 | Akamatsu |
| 6,236,179 B1 | * | 5/2001 | Lawler ............. B60L 11/1807 318/375 |
| 7,129,599 B2 | | 10/2006 | Divan et al. |
| 7,920,392 B2 | | 4/2011 | Schneider et al. |
| 2003/0183838 A1 | * | 10/2003 | Huang ............. H03K 17/08148 257/107 |
| 2007/0114223 A1 | * | 5/2007 | Stonestreet, II ....... B64D 15/12 219/482 |
| 2011/0002148 A1 | | 1/2011 | Iturriz et al. |

(Continued)

OTHER PUBLICATIONS

Non-Final Office Action on U.S. Appl. No. 14/816,642 dated Nov. 6, 2017.

(Continued)

*Primary Examiner* — Quan Tra
(74) *Attorney, Agent, or Firm* — Foley & Lardner LLP

(57) ABSTRACT

A device includes a first silicon-controlled rectifier (SCR), a second SCR connected in anti-parallel with the first SCR, and a commutation module. The commutation module is configured to apply a reverse bias voltage to the first SCR or the second SCR to turn off the first SCR or the second SCR. The device further includes a voltage clamp configured to dissipate energy when the first SCR or the second SCR are turned off. The voltage clamp is charged as one of the first SCR or the second SCR are powered on.

17 Claims, 21 Drawing Sheets

(56) References Cited

U.S. PATENT DOCUMENTS

2012/0228945 A1    9/2012  Abe et al.
2016/0065209 A1*  3/2016  Shen .................. H03K 17/73
                                                    327/453
2016/0368392 A1   12/2016  Braun et al.

OTHER PUBLICATIONS

Non-Final Office Action on U.S. Appl. No. 14/816,642 dated Mar. 2, 2017.
Excerpt from GE SCR Manual, Construction and Basic Theory of Operation, 1 page.
Final Office Action on U.S. Appl. No. 14/816,642 dated Jun. 19, 2017.
Notice of Allowance on U.S. Appl. No. 14/816,642 dated Apr. 11, 2018.

* cited by examiner

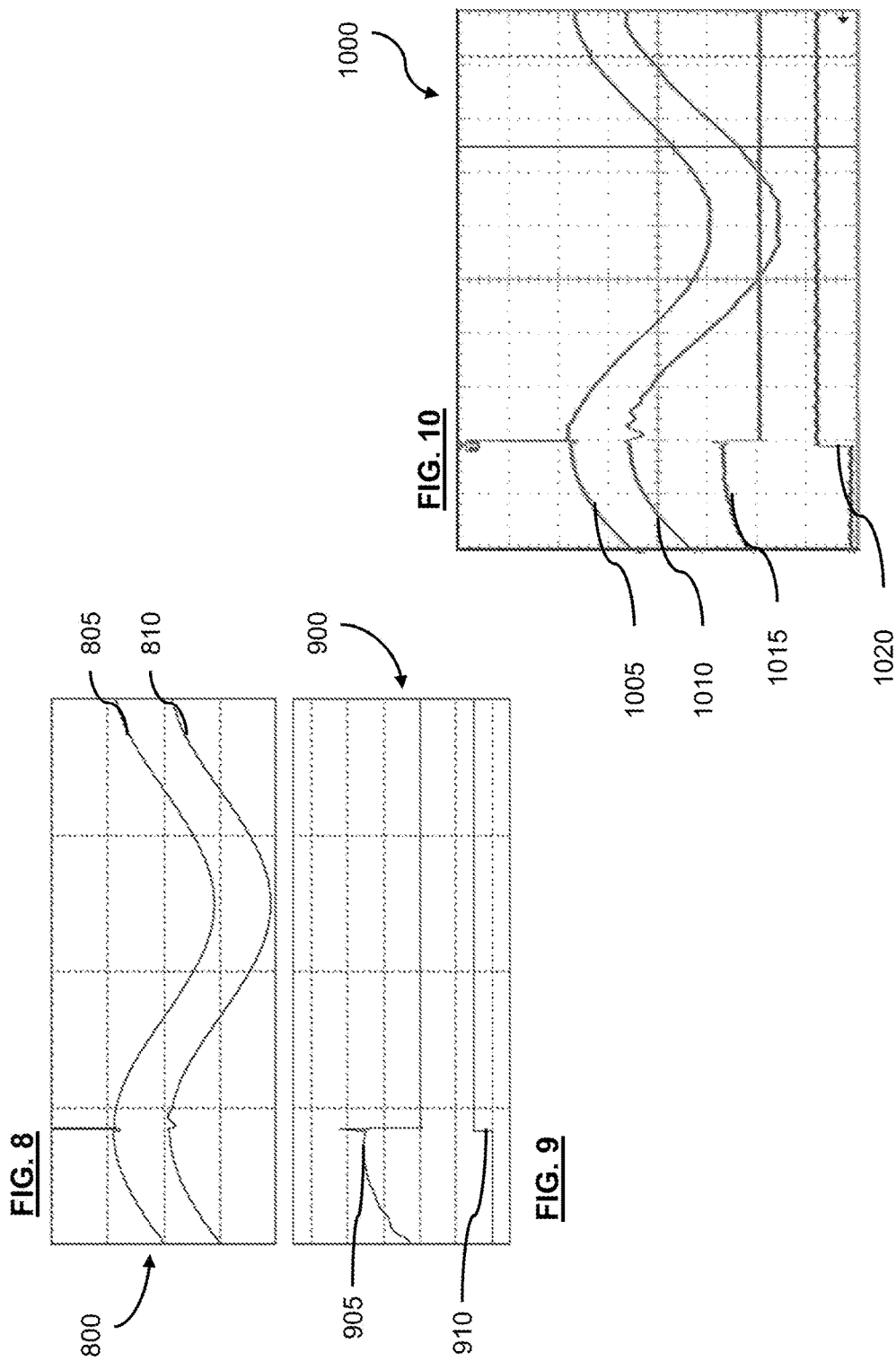

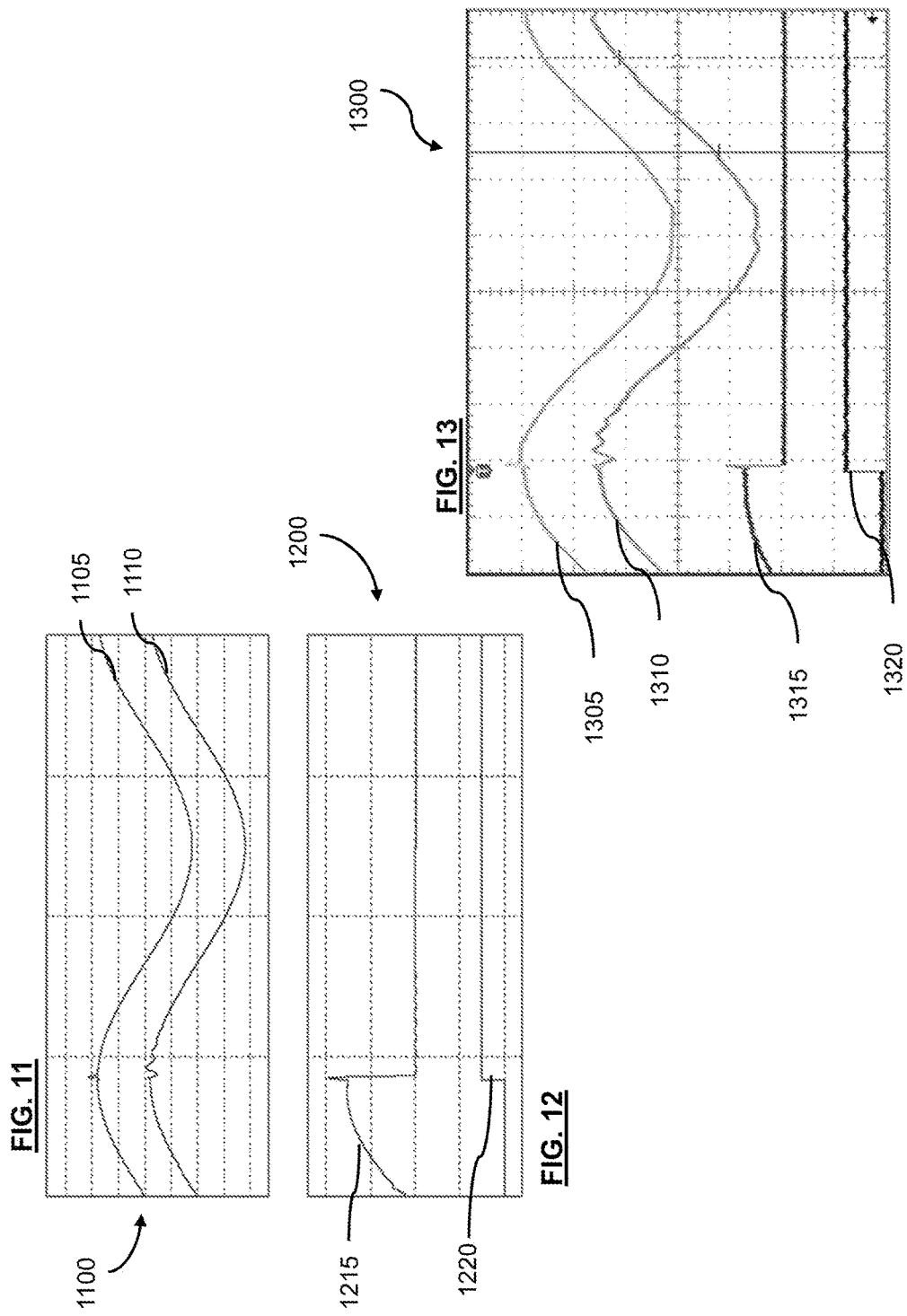

AUXILIARY COMMUTATED SILICON-CONTROLLED RECTIFIER CIRCUIT METHODS AND SYSTEMS

BACKGROUND

An electrical load which receives power through an AC power system is generally designed to operate reliably when the actual supply input voltage is within approximately 10% of the rated supply input voltage. A voltage sag (or dip) can refer to a temporary reduction of the rms AC voltage in which the actual supply input voltage is below approximately 90% of the rated supply input voltage. A dynamic voltage sag correction device can refer to a device which is capable of correcting temporary voltage sags in a voltage input signal that is being provided to a load. Voltage sags can be caused by startup of a large load within a facility, a circuit fault, a fault on the utility transmission or distribution system, a problem with a generator, or any of a number of other reasons. The dynamic voltage sag correction device is generally inserted between the voltage input and the load, and includes a combination of circuit elements and logic which are adapted to provide a correction signal almost instantaneously. A dynamic voltage sag correction device is one type of device that may utilize a static switch. A static switch may be used in a dynamic voltage sag correction device to switch between a supply input voltage and a correction signal.

SUMMARY

An illustrative device includes a first silicon-controlled rectifier (SCR), a second SCR connected in anti-parallel with the first SCR, and a commutation module. The commutation module is configured to apply a reverse bias voltage to the first SCR or the second SCR to turn off the first SCR or the second SCR. The device further includes a voltage clamp configured to dissipate energy when the first SCR or the second SCR are turned off. The voltage clamp is charged as one of the first SCR or the second SCR are powered on.

An illustrative method includes connecting a first silicon-controlled rectifier (SCR), a second SCR, and a commutation module in parallel. The method further includes connecting a load to an operating signal and passing the operating signal through the SCR to the load. The voltage clamp is charged as one of the first SCR or the second SCR are powered on. The method further includes applying, by the commutation module, a reverse bias voltage to the first SCR to turn off the first SCR. The method further includes dissipating energy with a voltage clamp when the first SCR or the second SCR is turned off.

An illustrative device includes a silicon-controlled rectifier (SCR) and a commutation module including a voltage source, a first diode, and a self-commutating semiconductor switch. The voltage source, the first diode, and the self-commutating semiconductor switch of the commutation module are connected in series. The SCR is connected in parallel to the commutation module. The commutation module is configured to apply a reverse bias voltage to the SCR to turn it off.

An illustrative method includes connecting a silicon-controlled rectifier (SCR) and a commutation module in parallel. The commutation module includes a voltage source, a first diode, and a self-commutating semiconductor switch connected in series. The method further includes connecting a load to an operating signal. The method further includes passing the operating signal through the SCR to the load. The method further includes applying, by the commutation module, a reverse bias voltage to the SCR to turn off the SCR.

Another illustrative device includes a first silicon-controlled rectifier (SCR) and a second silicon-controlled rectifier (SCR) connected in anti-parallel and a first commutation module, which includes a first voltage source, a first diode, and a first self-commutating semiconductor switch. The device also includes a second commutation module including a second voltage source, a second diode, and a second self-commutating semiconductor switch. The first voltage source, the first diode, and the first self-commutating semiconductor switch of the first commutation module are connected in series. The second voltage source, the second diode, and the second self-commutating semiconductor switch of the second commutation module are connected in series. The first SCR, the second SCR, the first commutation module, and the second commutation module are connected in parallel. The first commutation module is configured to apply a first reverse bias voltage to the first SCR to turn off the first SCR, and the second commutation module is configured to apply a second reverse bias voltage to the second SCR to turn off the second SCR.

Another illustrative device includes a first silicon-controlled rectifier (SCR) and a second silicon-controlled rectifier (SCR) connected in anti-parallel. The device further includes a commutation module connected in parallel with the first SCR and the second SCR. The commutation module includes a first terminal on a supply side of the device connected to an anode side of a third silicon-controlled rectifier (SCR) and a cathode side of a fourth silicon-controlled rectifier (SCR). The commutation module further includes a second terminal on a load side of the device connected to an anode side of a fifth silicon-controlled rectifier (SCR) and a cathode side of a sixth silicon-controlled rectifier (SCR). The commutation module further includes a third terminal connected to a cathode side of the third SCR, a cathode side of the fifth SCR, and a first side of a self-commutating semiconductor switch. The commutation module further includes a fourth terminal connected to an anode side of the fourth SCR, an anode side of the sixth SCR, and a first side of a voltage source. The commutation module further includes a fifth terminal connected to a second side of the self-commutating semiconductor switch and a second side of the voltage source.

Another illustrative method includes connecting an alternating current (AC) static switch and a commutation module in parallel. The AC static switch includes a first silicon-controlled rectifier (SCR) and a second silicon-controlled rectifier (SCR) connected in anti-parallel. The method further includes connecting a load to an operating signal through the AC static switch during a normal operating condition. The AC static switch is in a closed position during the normal operating condition. The method further includes detecting, by a controller, a voltage sag or voltage swell. The method further includes applying a reverse bias voltage to the first SCR or the second SCR of the AC static switch. The AC static switch is in an open position during at least a portion of the voltage sag or voltage swell. The reverse bias voltage turns off the first SCR or the second SCR.

Another illustrative method includes applying a Normal_On signal to an alternating current (AC) static switch comprising a first silicon-controlled rectifier (SCR) and a second silicon-controlled rectifier (SCR) connected in anti-parallel. The first SCR and the second SCR are turned on. The method further includes detecting a voltage sag or voltage swell in an operating signal passing through the AC static switch, wherein the operating signal is an alternating current signal. The method further includes removing the Normal_On signal from the first SCR and the second SCR in response to detecting the voltage sag or voltage swell. The method further includes applying a first reverse bias voltage to the first SCR when a positive current is flowing through the first SCR. The method further includes applying a second reverse bias voltage to the second SCR when a negative current is flowing through the second SCR.

BRIEF DESCRIPTION OF THE DRAWINGS

Illustrative embodiments will hereafter be described with reference to the accompanying drawings.

FIG. 8 is a graph illustrating simulated voltage results of an auxiliary commutated SCR circuit without a voltage clamp in accordance with an illustrative embodiment.

FIG. 9 is a graph illustrating simulated current results of an auxiliary commutated SCR circuit without a voltage clamp in accordance with an illustrative embodiment.

FIG. 10 is a graph illustrating laboratory results of an auxiliary commutated SCR circuit without a voltage clamp in accordance with an illustrative embodiment.

FIG. 11 is a graph illustrating simulated voltage results of an auxiliary commutated SCR circuit with a voltage clamp in accordance with an illustrative embodiment.

FIG. 12 is a graph illustrating simulated current results of an auxiliary commutated SCR circuit with a voltage clamp in accordance with an illustrative embodiment.

FIG. 13 is a graph illustrating laboratory results of an auxiliary commutated SCR circuit with a voltage clamp in accordance with an illustrative embodiment.

DETAILED DESCRIPTION

Figure 1:
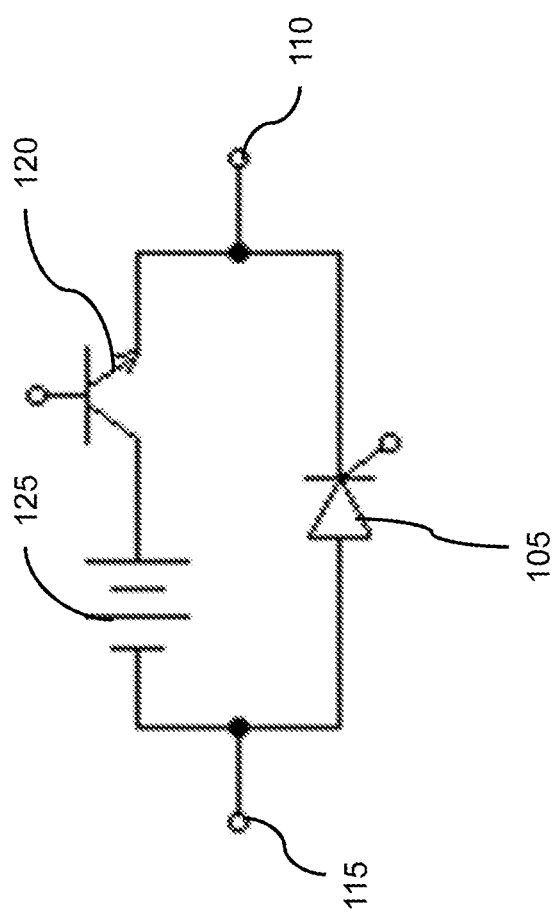
FIG. 1 is a circuit diagram illustrating an auxiliary commutated silicon-controlled rectifier (SCR) in accordance with an illustrative embodiment.

Disclosed herein are illustrative systems and methods for a static switch used, for example, in voltage sag or voltage swell correction devices. Static switches disclosed herein can include thyristors such as silicon-controlled rectifiers (SCR).

In particular, disclosed herein are improved auxiliary commutated SCR circuits. Such circuits may be used in voltage sag or swell detection and/or correction as disclosed herein. The circuits disclosed herein can reduce the number of components used in auxiliary commutated SCR circuits, reduce the complexity of the circuits, and provide a cheaper and more reliable circuit for auxiliary commutated SCR circuits. In particular, various configurations and embodiments for voltage clamp(s) for use in auxiliary commutated SCR circuits are disclosed herein.

Advantageously, SCR devices used in static switches as disclosed herein may be used in many different applications. As just one example, static switches with SCRs may be used in voltage sag or voltage swell correction devices, including single phase and three (3) phase Dynamic Sag Corrector (DySC) devices. Such devices may be rugged, low cost, have high surge capabilities, and have a low loss. For an illustrative example of a DySC device, see U.S. Pat. No. 7,920,392, which is incorporated herein by reference in its entirety.

Other uses of a static switch are also contemplated. In an illustrative embodiment, a static switch as disclosed herein may be used anywhere a direct current (DC) or alternating current (AC) static switch may be used. For example, an AC static switch as disclosed herein may be used as a transfer switch to switch a load between multiple sources. Similarly, a static switch may be used to switch quickly between power sources where an uninterruptible power supply (UPS) is used. In another example, the static switches disclosed herein may be used in an automatic voltage regulator.

In an illustrative embodiment, a static switch as disclosed herein may be used to switch between sources in a dual feed power system. A dual feed power system may also, in some embodiments, utilize a voltage sag or voltage swell corrector. In such an embodiment, a static switch may be used to quickly switch between the dual feeds if a problem (such as a voltage sag or voltage swell or outage) is detected with one of the sources. For an illustrative example of a dual source DySC device, see U.S. Pat. No. 7,129,599, which is incorporated herein by reference in its entirety.

Such static switch applications may, as disclosed herein, utilize a circuit to commutate the SCRs. That is, when SCRs are used as a switch, circuit components can be used as disclosed herein to force commutate the SCRs off. The SCRs can remain on and prevent optimal functioning of a static switch if the SCRs are not commutated off quickly. In other words, an SCR may be turned on (thus a static switch is on or closed) by applying a signal to the gate of the SCR, but the SCR may functionally remain on even if the gate signal applied to the SCR is removed. Accordingly, an auxiliary commutation circuit as disclosed herein may be utilized to turn off an SCR (and subsequently a static switch with an SCR). In order to commutate an SCR off, current through the SCR should be forced to zero by applying a reverse bias voltage to the SCR. Accordingly, in an example where static switches are used in a voltage sag or voltage swell correction device, the device may detect a sag in an operating signal, and the device can commutate a static switch (i.e., the SCRs used in the static switch) off, which allows the device to disconnect the operating signal and apply a correction signal to correct the sag.

FIG. 1 is a circuit diagram illustrating an auxiliary commutated silicon-controlled rectifier (SCR) in accordance with an illustrative embodiment. In alternative embodiments, fewer, additional, and/or different elements may be present. The auxiliary commutated SCR circuit in FIG. 1 shows a commutating device that can momentarily divert current from an SCR to turn it off.

FIG. 1 includes an input terminal 115 and an output terminal 110. FIG. 1 also includes a voltage source 125, a self-commutating semiconductor switch 120, and an SCR 105. The voltage source 125 and the self-commutating semiconductor switch 120 are connected in series. The voltage source 125 is connected to the input terminal 115, while the self-commutating semiconductor switch 120 is connected to the output terminal 110. The SCR 105 is connected to the input terminal 115 and the output terminal 110, as well as being connected in parallel with the voltage source 125 and the self-commutating semiconductor switch 120.

In order to commutate the SCR 105 (turn it off), a first gate current must be removed from the SCR 105, then the self-commutating semiconductor switch 120 can be pulsed on to apply a reverse bias voltage to the SCR 105 from the voltage source 125 for at least the length of the SCR 105's turn-off time. In this way, the SCR 105 can be adequately turned off when desired. In one illustrative embodiment, a switched current source may be connected to the SCR 105 gate in order to turn it on and off.

Figure 2:
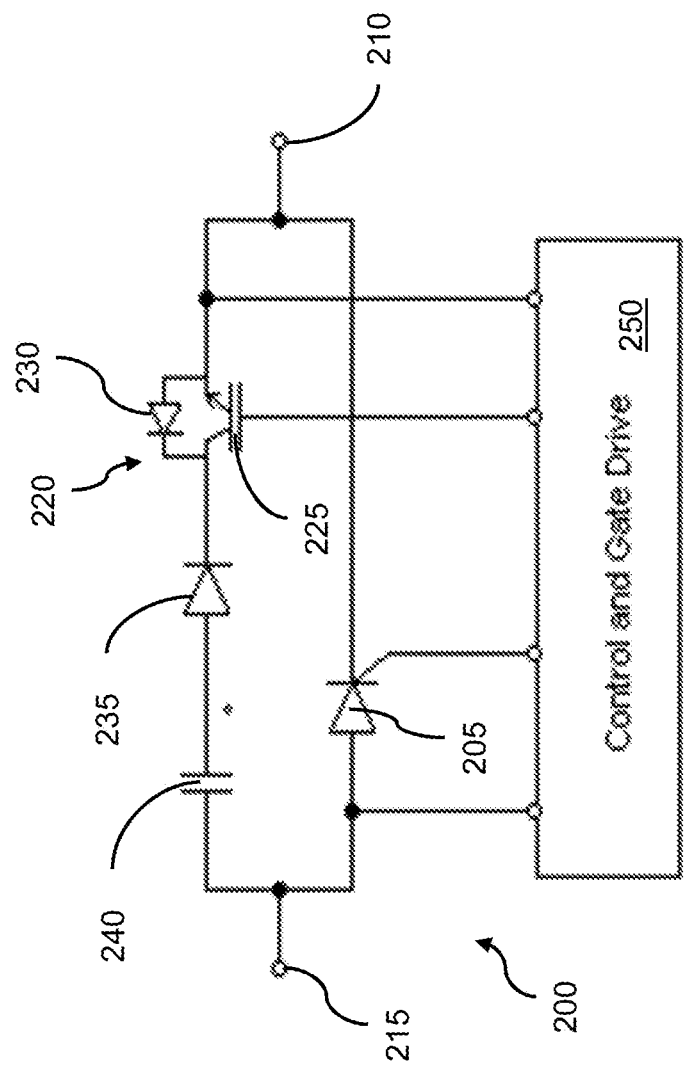
FIG. 2 is a circuit diagram illustrating an auxiliary commutated SCR with an insulated-gate bipolar transistor (IGBT) and a control and gate drive in accordance with an illustrative embodiment.

FIG. 2 is a circuit diagram illustrating an auxiliary commutated SCR with an insulated-gate bipolar transistor (IGBT) and a control and gate drive 250 in accordance with an illustrative embodiment. The IGBT of FIG. 2 is a type of self-commutated transistor device. In alternative embodiments, fewer, additional, and/or different elements may be present. A circuit 200 in FIG. 2 shows an SCR 205, a capacitor 240, a first diode 235, and a self-commutating semiconductor switch 220. The self-commutating semiconductor switch 220, the diode 235, and the capacitor 240 are connected in series, as well as to an input terminal 215 and an output terminal 210. The SCR 205 is connected to the input terminal 215 and the output terminal 210, and is also connected in parallel with the series string comprising capacitor 240, the first diode 235, and the self-commutating semiconductor switch 220. The self-commutating semiconductor switch 220 includes a self-commutating transistor device (IGBT) 225 and a second diode 230. The self-commutating transistor device 225 and the second diode 230 are connected in anti-parallel to form a uni-directional semiconductor switch.

The self-commutating transistor device 225 can be an insulated-gate bipolar transistor (IGBT). In alternative embodiments, other self-commutating devices may be used, such as a MOSFET transistor. Collectively, the self-commutating semiconductor switch 220, the first diode 235, and the capacitor 240 may be referred to as a commutation module. A commutation module may contain different components and or different configurations than shown in the circuit 200, but the circuit 200 shows one illustrative embodiment of a commutation module.

In the circuit 200, the capacitor 240 is used as a voltage source for commutating the SCR 205 off. In alternative embodiments, other voltage sources may be used, such as a battery. A voltage source or, as in the circuit 200, the capacitor 240 provides a reverse bias voltage to the SCR 205. The capacitor 240 is sized to provide enough voltage for various circuit drops plus sufficient voltage to reverse bias to the SCR 205. The first diode 235 is also used to provide reverse blocking of line voltage when the SCR 205 is off. The first diode 235 may be a high-voltage diode. Voltage provided by the capacitor 240 may be on the order of 20-30 volts for smaller devices, and on the order of 30-50 volts for larger devices with larger circuit inductances.

In the circuit 200, the capacitor 240 is directly connected to an anode side of the first diode 235, and the self-commutating semiconductor switch 220 is directly connected to a cathode side of the first diode 235. The input terminal 215 is configured to receive an operating signal. The output terminal 210 is in electrical communication with the input terminal 215 when the static switch is closed. The operating signal is provided to a load from the output terminal. The circuit 200 may also be utilized in any type of circuit that includes use for a force commutated SCR.

The circuit 200 as shown connects a silicon-controlled rectifier (SCR) 205 and a commutation module in parallel. The commutation module includes a voltage source (the capacitor 240), the diode 235, and the self-commutating semiconductor switch 220. The circuit 200 also connects a load to an operating signal. The load may be connected to the output terminal 210, while the operating signal may be connected to the input terminal 215. Accordingly, when the SCR 205 is turned on, current may be passed from the input terminal 215 to the load through the SCR 205. The SCR 205 may be turned off by first removing a gate current and then by applying, by the commutation module, a reverse bias voltage to the SCR 205, and the operating signal may not be connected to the output terminal 210 and the load. As noted above, applying the reverse bias voltage to the SCR may include applying a signal to a gate of the self-commutating transistor device 225 in order to apply the reverse bias voltage to the SCR 205. The static switch (the SCR 205) is in the closed position during a normal operating condition such that the operating signal may pass through the static switch to the output terminal 210. When the SCR 205 is turned off, the static switch is in an open position In another illustrative embodiment, a DC static switch such as the circuit 200 may also be used for fast disconnects as a solid state DC circuit breaker. Such a switch could be implemented without the use of moving parts, such as those often used in mechanical circuit breakers. For example, a system may include a battery bank connected to an inverter DC bus. Such a system may utilize a near instantaneous turn-off of DC current using a DC static switch, such as the circuit 200.

Figure 3A:
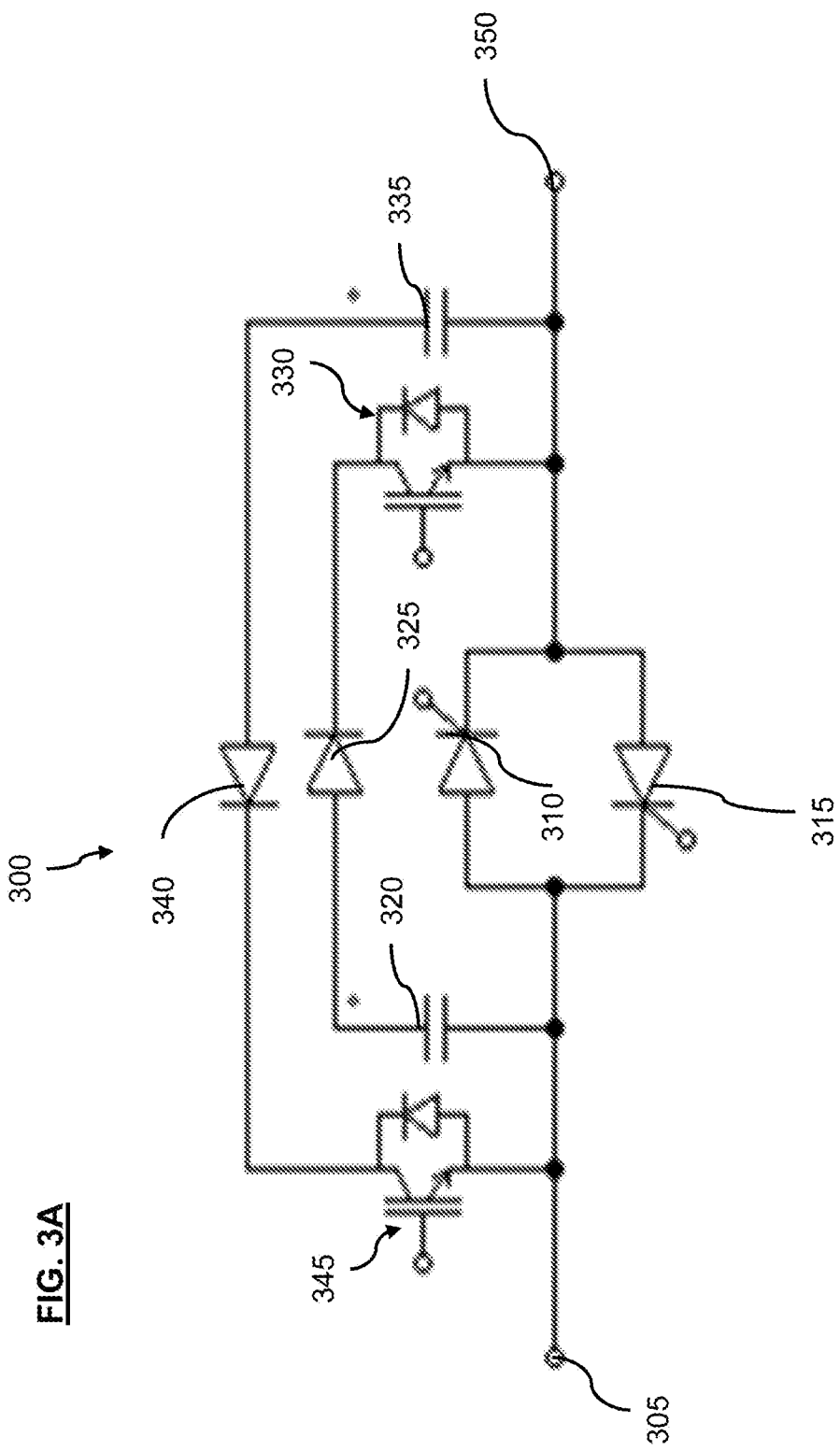
FIG. 3A is a circuit diagram illustrating a full alternating current (AC) switch utilizing SCRs and IGBTs in accordance with an illustrative embodiment.

FIG. 3A is a circuit diagram illustrating a full alternating current (AC) switch utilizing SCRs and IGBTs in accordance with an illustrative embodiment. In alternative embodiments, fewer, additional, and/or different elements may be present. In a circuit 300, two silicon-controlled rectifiers (SCRs) 310 and 315 are connected in anti-parallel and form a switch that can be used as an alternating current (AC) static switch and commutation module in conjunction with a voltage sag or voltage swell correction device. The circuit 300 includes two commutation modules for the two SCRs 310 and 315. Each of the commutation modules includes a voltage source (voltage sources 320 and 335). Furthermore, each of the commutation modules can share a common power supply with each of the SCR 310 and SCR 315 gate drivers. A gate drive circuit (not pictured here) for the insulated-gate bipolar transistors (IGBTs) 330 and 345 draws very little power because a gate pulse supplied to the IGBTs 330 and 345 may be short in duration and infrequent. For example, such gate pulses may be on the order of 100 to 300 microseconds (µs) at a frequency on the order of AC line frequencies. In alternative embodiments, other self-commutating devices than IGBTs may be used, such as MOSFET transistors.

The circuit 300 includes a first and second commutation module for each of SCR 310 and SCR 315. The first commutation module includes the voltage source 320, a diode 325, and a self-commutating semiconductor switch 330, which are all connected in series. Similarly, the second commutation module includes the voltage source 335, a diode 340, and a self-commutating semiconductor switch 345, which are all connected in series. The SCR 310, the SCR 315, the first commutation module, and the second commutation module are all connected in parallel. The voltage sources 320 and 335 may be different types of sources in different embodiments, such as capacitors or batteries. The first commutation module is configured to apply a reverse bias voltage to the SCR 310 to turn off the SCR 310. The second commutation module is configured to apply a reverse bias voltage to the SCR 315 to turn off the SCR 315. As discussed above, the reverse bias voltages used to turn off the SCRs 310 and 315 may be on the order of 20-50 volts.

In one embodiment, the circuit 300 may be utilized as an AC static switch in a voltage sag or voltage swell correction device. A regulator module may also be used in this embodiment to apply a correction signal during at least a portion of a voltage sag or voltage swell. The regulator module may be connected to an output terminal 350 to apply the correction signal to a load connected to the output terminal 350. In other various embodiments, a regulator module may also be connected to an input terminal 305, such as those shown in the incorporated reference U.S. Pat. No. 7,920,392 or FIG. 6 as disclosed herein. During a normal operating condition, the SCRs 310 and 315 (collectively the AC static switch) are on (or in a closed position) allowing AC current to flow through the AC static switch. The static switch can be closed by applying a signal to each of the gates of the SCRs 310 and 315 to make sure that they are active and current can flow through them. In this way, the regulator module can be bypassed. When a voltage sag or voltage swell is detected by a device controller, the AC static switch is switched off (the AC static switch is in an open position during at least a portion of the voltage sag or voltage swell) so that the regulator module is not bypassed by the switch. In this way, a correction signal may be applied to the output signal 350 during at least a portion of a voltage sag or voltage swell. In order to turn off the switch, gate signals of both SCRs are removed immediately before a commutation pulse of the proper time duration is applied the particular conducting SCR. Then the system determines which of the SCRs 310 and 315 has current flowing through it. The device controller also determines whether the sag is happening during a positive current flow or negative current flow of the AC operating signal. In this way, the correct commutation module can be triggered to supply a pulse to turn off the SCR that is on during the voltage sag or voltage swell. For example, if a voltage sag or voltage swell occurs during a positive current flow, through SCR 310, the first commutation module should be triggered to send a pulse to turn off the SCR 310. If a voltage sag or voltage swell occurs during a negative current flow, through the SCR 315, the second commutation module should be triggered to send a pulse to turn off the SCR 315.

Figure 3B:
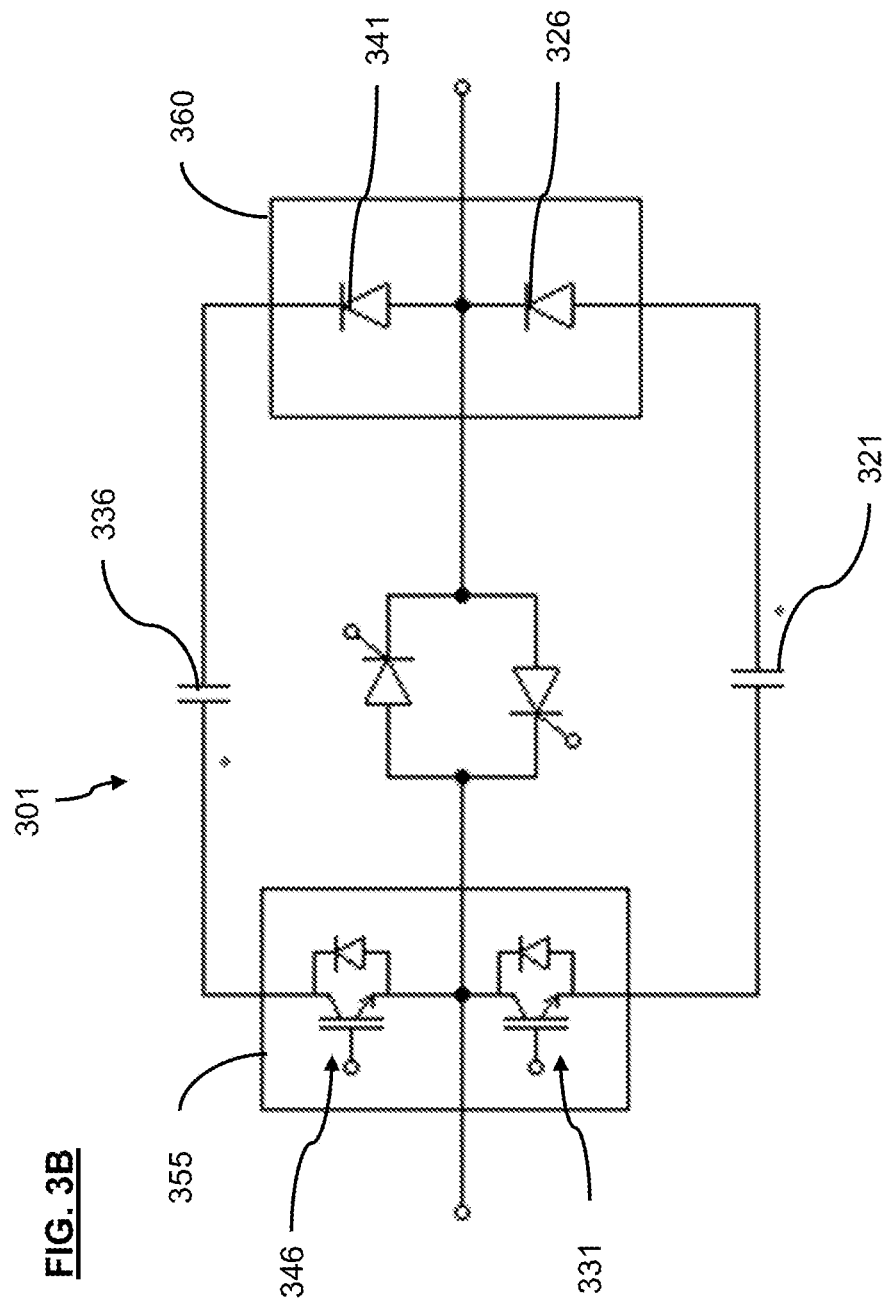
FIG. 3B is a circuit diagram illustrating a full alternating current (AC) switch utilizing paired self-commutating semiconductor switches and diodes in accordance with an illustrative embodiment.

In some embodiments, circuit components may be reduced because self-commutating semiconductor switches, as well as diodes, may be sold in pairs. FIG. 3B is a circuit diagram illustrating a full alternating current (AC) switch 301 utilizing paired self-commutating semiconductor switches and diodes in accordance with an illustrative embodiment. In alternative embodiments, fewer, additional, and/or different elements may be present.

In the circuit 301, a diode pair 360 includes a diode 341 and a diode 326. The diode pair may be used, for example, in place of the diodes 325 and 340 of FIG. 3A. The circuit 301 also includes a self-commutating switch pair 355. The self-commutating switch pair 355 includes a self-commutating switch 346 and a self-commutating switch 331. The self-commutating switch pair 355 may be used, for example, in place of the self-commutating semiconductor switch 345 and the self-commutating semiconductor switch 330. Accordingly, in the circuit 301, the diode 326, the self-commutating switch 331, and a capacitor 321 can function as a first commutation module, similar to the first commutation module described above with respect to FIG. 3A. Similarly, the diode 341, the self-commutating switch 346, and the capacitor 346 can function as a second commutation module, similar to the second commutation module described above with respect to FIG. 3A.

Figure 4:
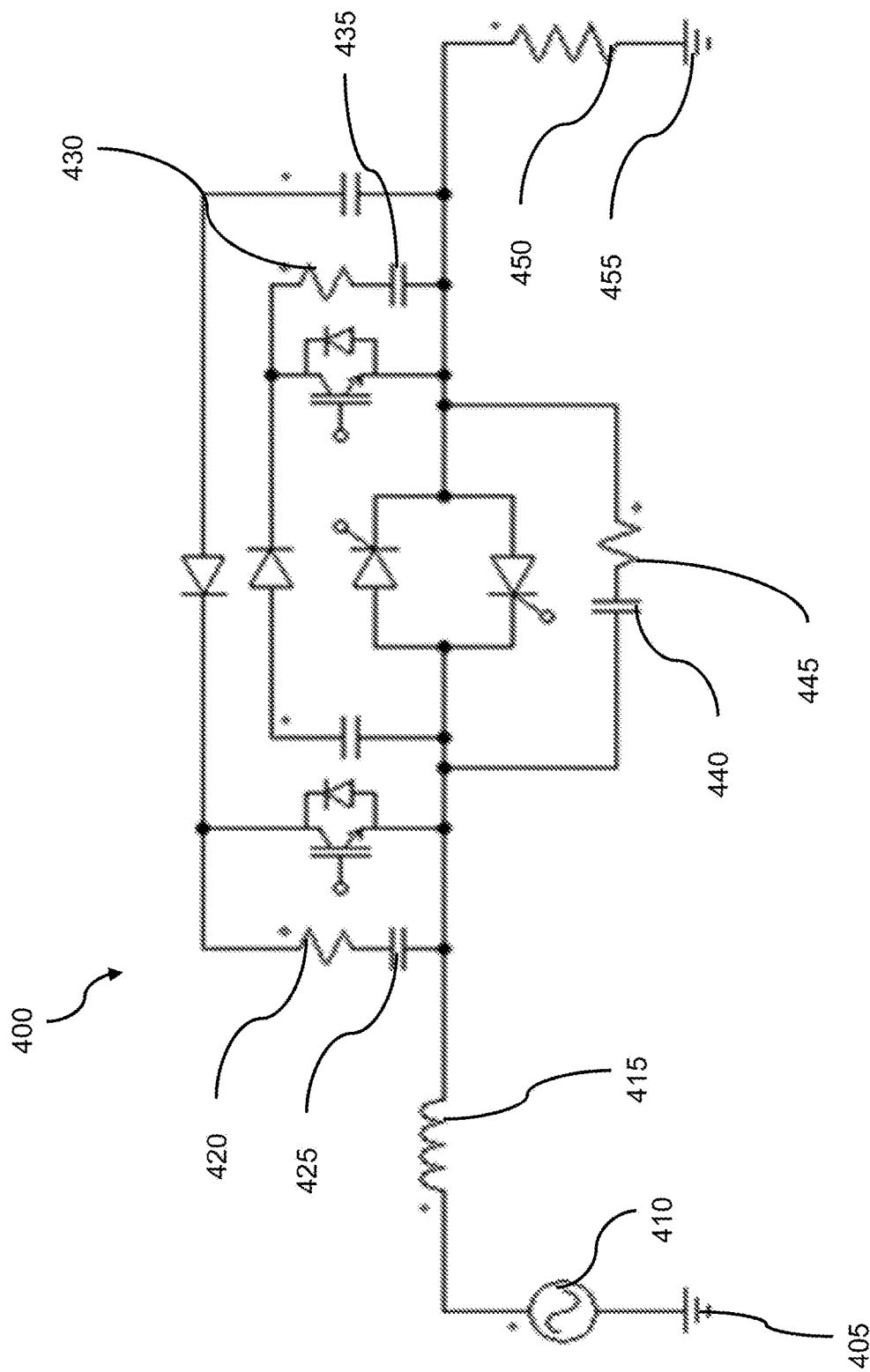
FIG. 4 is a circuit diagram illustrating an AC switch utilizing snubber components in accordance with an illustrative embodiment.

FIG. 4 is a circuit diagram illustrating an AC switch utilizing snubber components in accordance with an illustrative embodiment. In alternative embodiments, fewer, additional, and/or different elements may be present. A circuit 400 includes the naturally occurring parasitic line inductance 415 that may store energy that should be dissipated safely when an SCR is commutated off. Accordingly, the circuit 400 includes various snubber components which help absorb and dissipate energy stored in the line or load side inductances when an SCR (or AC static switch) is force-commutated off.

The circuit 400 includes similar elements to those shown in FIG. 3A and discussed above. The circuit 400 also includes an AC voltage source 410, system commons 405 and 455, and a load 450. As previously mentioned, the circuit 400 also includes a line (or load) inductance 415. The energy stored in the line inductance 415 may be dissipated by snubber components. The resistor-capacitor (RC) snubber components in the circuit 400 include a resistor 420 and capacitor 425 that are connected in series, and the whole snubber is connected in parallel with a self-commutating semiconductor switch of the second commutation module. The snubber components in the circuit 400 also include a resistor 430 and capacitor 435 that are connected in series, and the whole snubber is connected in parallel with a self-commutating semiconductor switch of the first commutation module. The snubber components in the circuit 400 also include a resistor 445 and capacitor 440 that are connected in series, and the whole snubber is connected in parallel with the AC static switch (SCRs). The various snubber components can dissipate energy trapped in the circuit inductance when the SCRs are commutated off. There may be other similar snubber configurations, known to those skilled in the art, which may be used to absorb parasitic circuit energy when the SCRs are commutated off.

At high currents, SCRs may be larger, and inductances in the line are larger because of greater distances between components in the system. RC snubbers as disclosed above may not be sufficient to dissipate greater energy stored in the circuit. Accordingly, a voltage clamp may be additionally used.

Figure 5A:
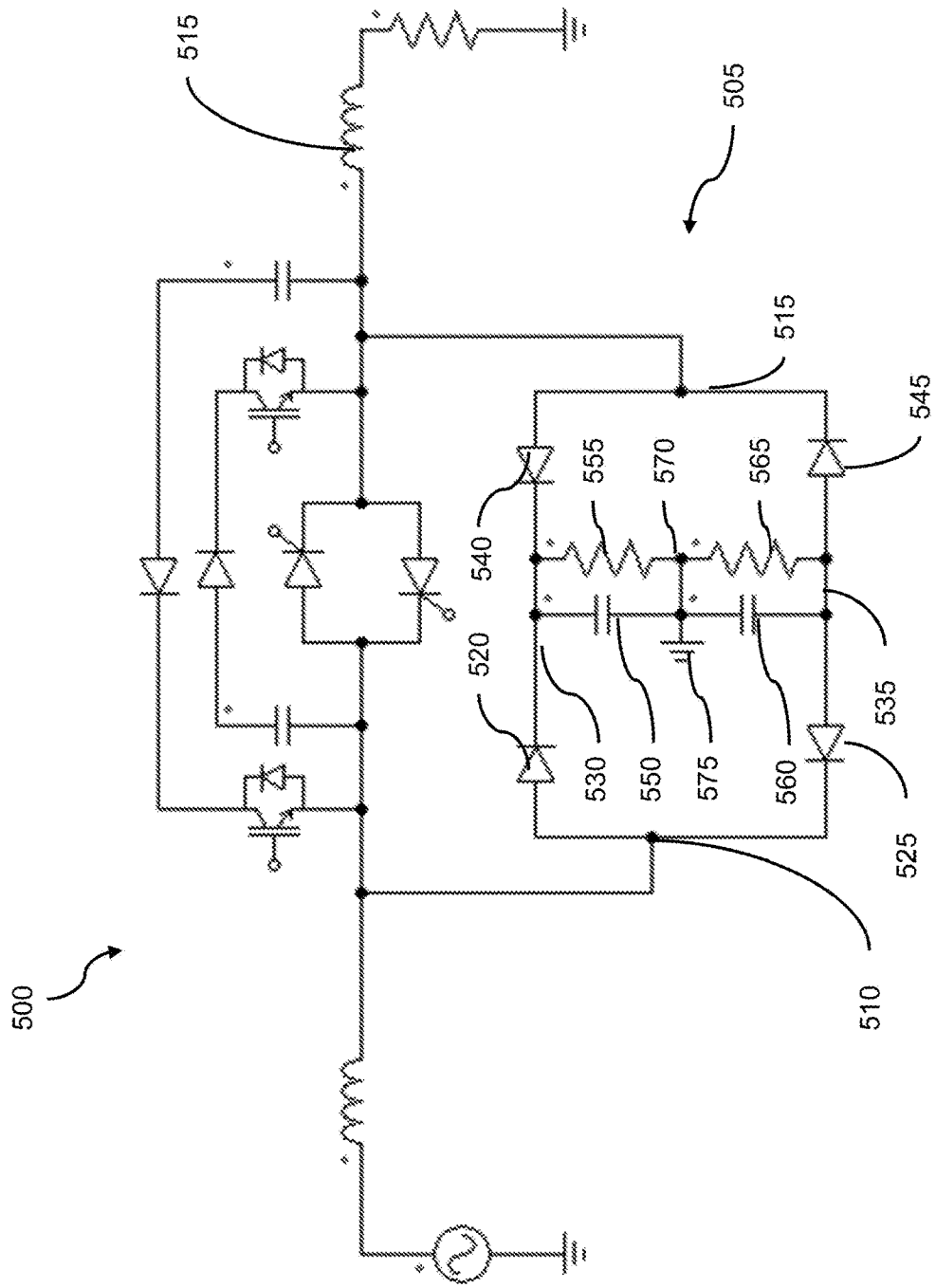
FIG. 5A is a circuit diagram illustrating an AC switch utilizing a bi-directional voltage clamp in accordance with an illustrative embodiment.

FIG. 5A is a circuit diagram illustrating circuit 500, an AC switch utilizing a bi-directional voltage clamp 505 in accordance with an illustrative embodiment. In alternative embodiments, fewer, additional, and/or different elements may be present. The circuit 500 includes elements similar to FIGS. 3 and 4, except the RC snubbers are not shown. Further, the circuit 500 includes parasitic line and load inductance 515.

The voltage clamp 505 is connected in parallel with the SCRs (AC static switch), the first commutation module, and the second commutation module. The voltage clamp 505 includes a terminal 510 on a supply side of the device connected to an anode side of a diode 520 and a cathode side of a diode 525. The voltage clamp 505 also includes a terminal 515 on the load side of the device connected to an anode side of a diode 540 and a cathode side of a diode 545. The voltage clamp 505 also includes a first capacitor/resistor group of capacitor 550 and resistor 555, as well as a second capacitor/resistor group of capacitor 560 and resistor 565. The capacitor and resistor of each group are connected in parallel. A terminal 530 of the voltage clamp 505 is connected to a cathode side of the diode 520, a cathode side of the diode 540, and the first capacitor/resistor group. A terminal 535 of the voltage clamp 505 is connected to an anode side of the diode 525, an anode side of the diode 545, and the second capacitor/resistor group. A terminal 570 of the voltage clamp 505 is connected to a system common 575, the first capacitor/resistor group, and the second capacitor/resistor group.

Figure 5B:
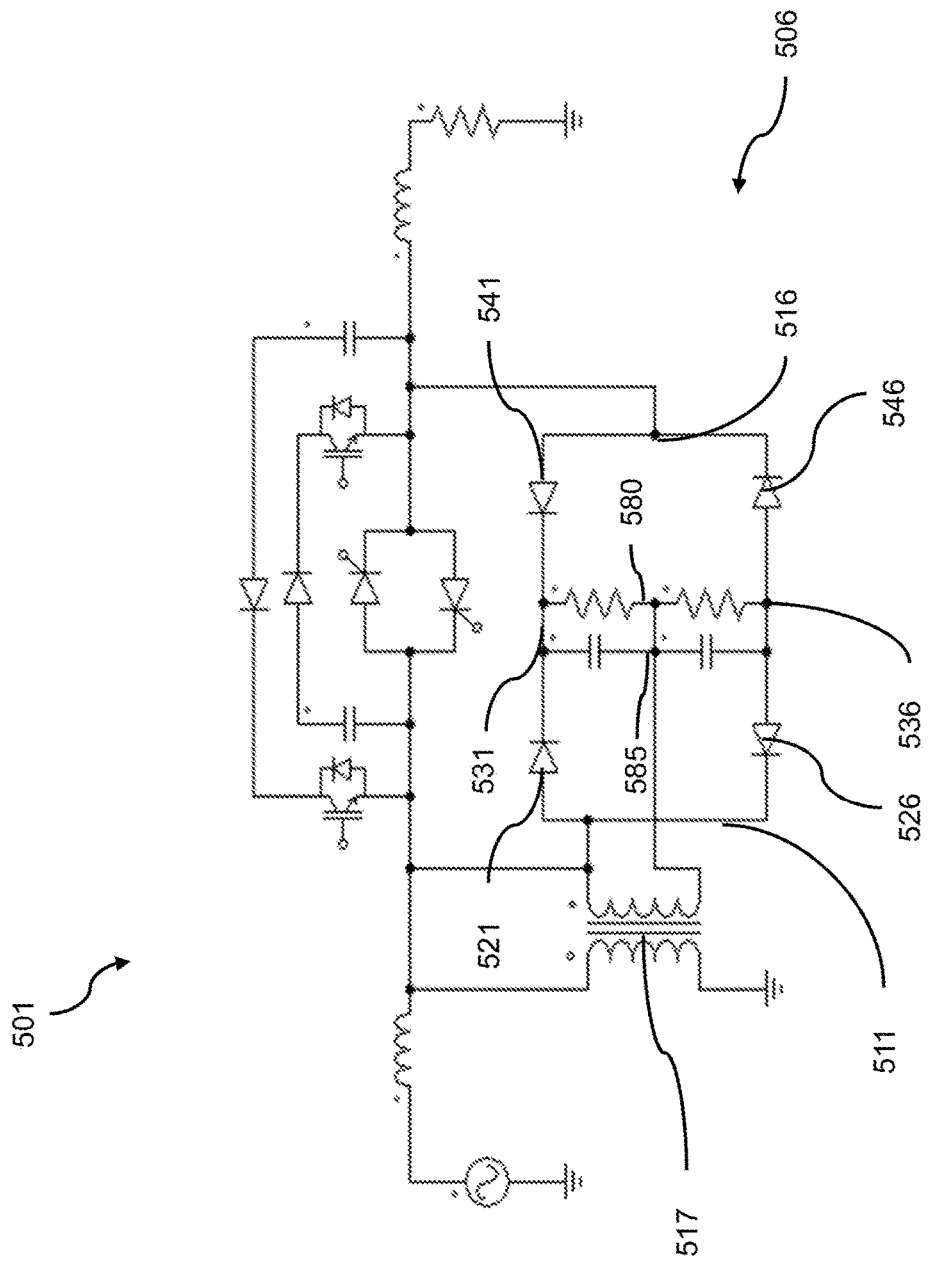
FIG. 5B is a circuit diagram illustrating an alternative embodiment of an AC switch utilizing an isolated bi-directional voltage clamp in accordance with an illustrative embodiment.

FIG. 5B is a circuit diagram illustrating an alternative embodiment of an AC switch utilizing an isolated bi-directional voltage clamp 506 in accordance with an illustrative embodiment. In alternative embodiments, fewer, additional, and/or different elements may be present. FIG. 5B shows a circuit 501, which has several similar components to the circuit 500 shown in FIG. 5A. However, the circuit 501 includes an isolation transformer 517 to charge the clamp capacitors. The midpoint of the series-connected capacitors are not referenced to circuit common in contrast to the midpoint of the capacitors of the voltage clamp 505 in FIG. 5A. The embodiment shown in FIG. 5B of the voltage clamp 506 can be used to implement an AC static switch in a three phase voltage sag corrector that has no available AC supply common (neutral). In other words, depending on the application, the capacitors of a voltage clamp may be referenced differently.

The voltage clamp 506 is connected in parallel with the SCRs (AC static switch), the first commutation module, and the second commutation module. The voltage clamp 506 includes a terminal 511 on a supply side of the device connected to an anode side of a diode 521 and a cathode side of a diode 526. The voltage clamp 506 also includes a terminal 516 on the load side of the device connected to an anode side of a diode 541 and a cathode side of a diode 546. The voltage clamp 506 also includes a capacitor 585 and resistor 580. The capacitor 585 and the resistor 580 are connected in parallel. A terminal 531 of the voltage clamp 506 is connected to a cathode side of the diode 521, a cathode side of the diode 541, the capacitor 585, and the resistor 580. A terminal 536 of the voltage clamp 506 is connected to an anode side of the diode 526, an anode side of the diode 546, the capacitor 585, and the resistor 580. The function of the voltage clamp is to absorb parasitic inductive energy in the same manner as the RC snubber referenced earlier. Energy is accumulated in the clamp capacitors in a large pulse as the SCRs are commutated and then the energy is dissipated more slowly through the parallel resistors.

Figure 6:
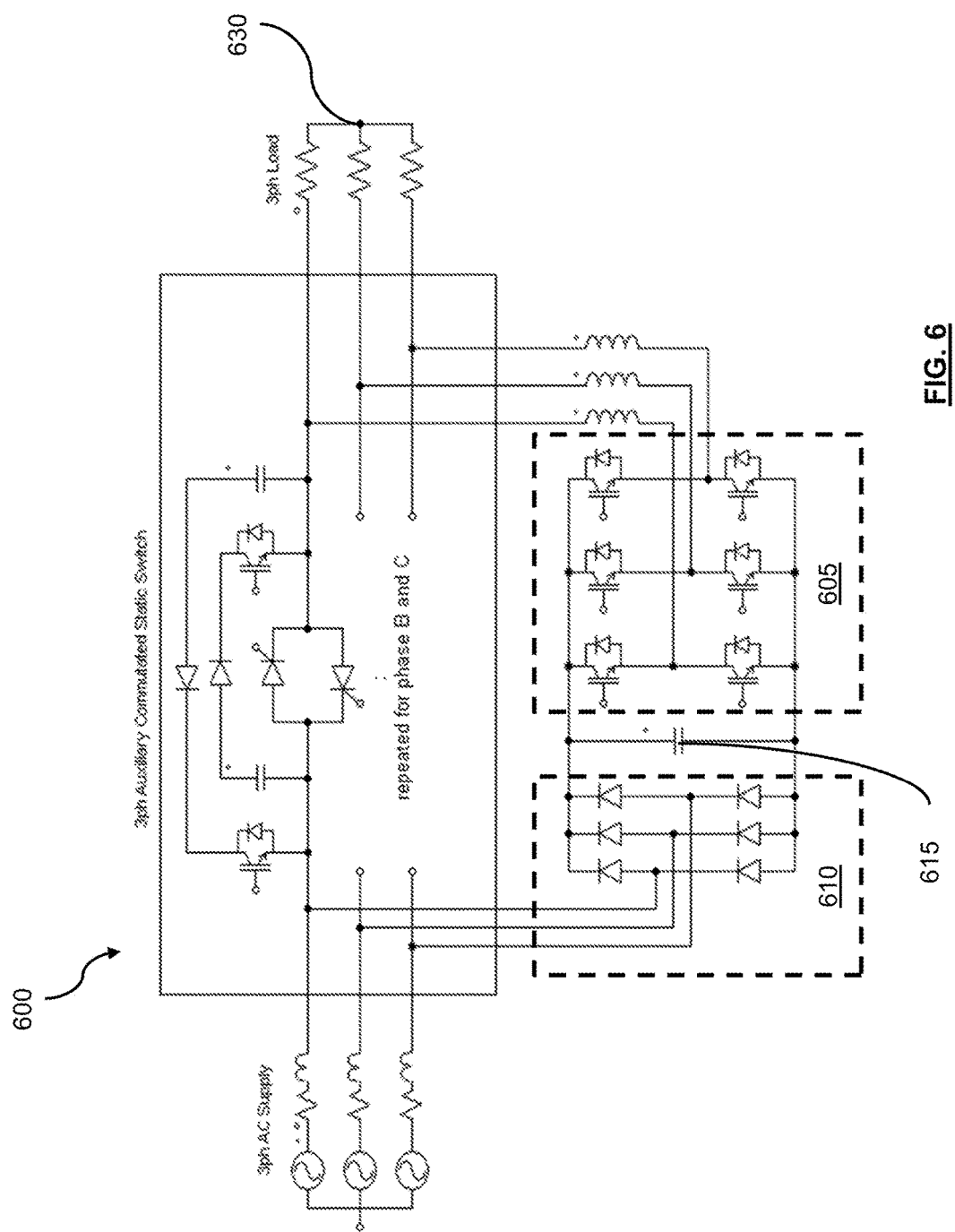
FIG. 6 is a circuit diagram illustrating a fully integrated AC switch with a shunt connected inverter and input rectifier in accordance with an illustrative embodiment.

FIG. 6 is a circuit diagram illustrating a fully integrated three phase AC static switch with a shunt connected inverter 605 and input rectifier 610 accordance with an illustrative embodiment. In alternative embodiments, fewer, additional, and/or different elements may be present. The circuit 600 shows a regulator module with a rectifier 610, a capacitor 615, and an inverter 605. The regulator module can apply a correction signal to a load 630 at least during a part of a voltage sag. Further, as shown in FIG. 6, where a shunt-connected inverter is on the load side of the AC static switch, a line rectified DC bus circuit may serve as a voltage clamp to absorb line side inductive energy. The anti-parallel inverter IGBT diodes and DC bus may also serve as a clamp to handle load side inductive energy. In other words, the static switch and inverter can essentially share some common components that provide different functions depending on whether the device is in a normal operating condition (AC static switch closed) or a voltage sag condition (AC static switch open). Although only one static switch is shown for the first A phase for clarity, a second and third static switch would also be present for the second B phase and the third C phase in an illustrative embodiment.

Figure 7A:
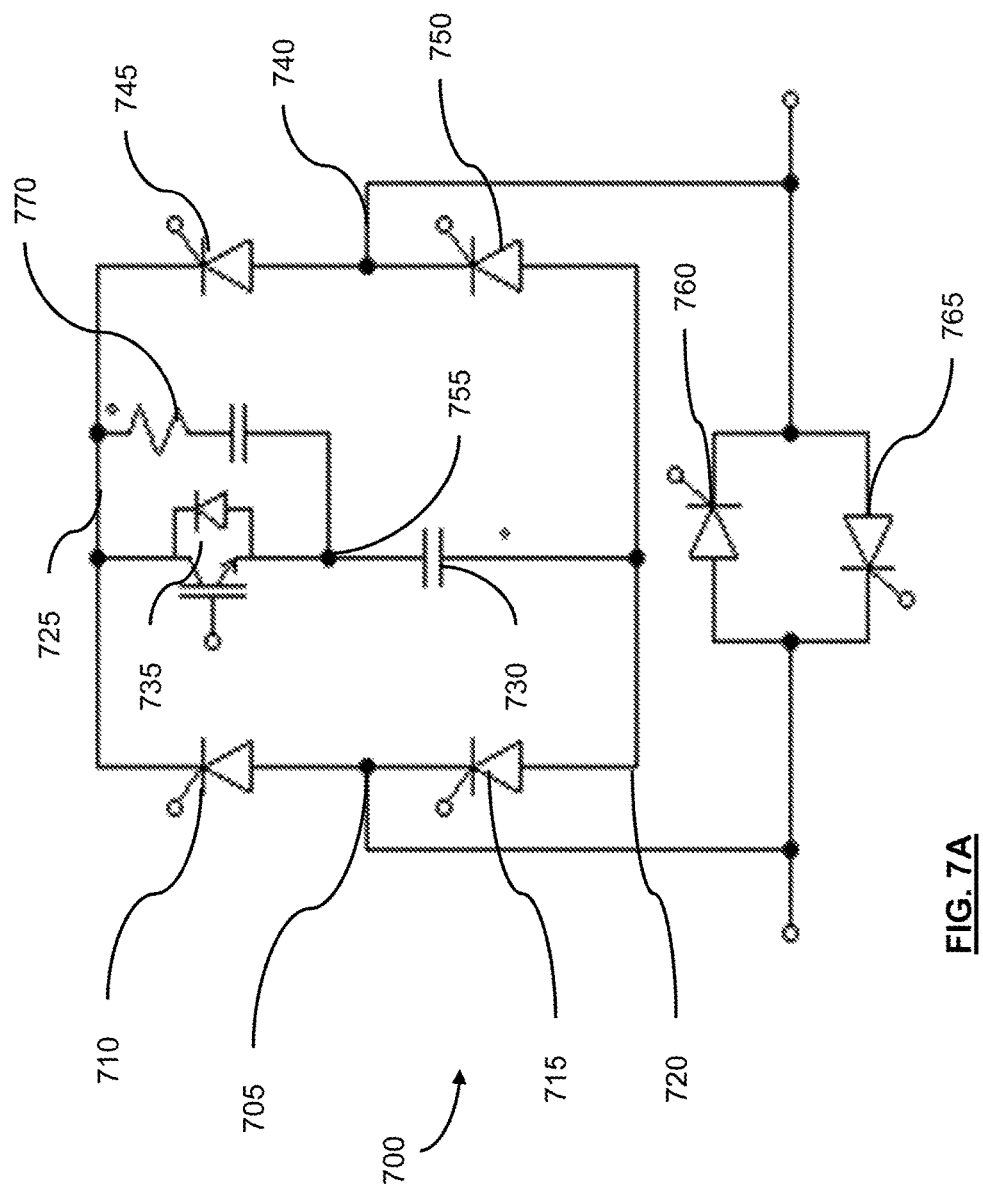
FIG. 7A is a circuit diagram illustrating an auxiliary commutated alternating current (AC) static switch circuit with only one IGBT and four auxiliary SCRs in accordance with an illustrative embodiment.

FIG. 7A is a circuit diagram illustrating an auxiliary commutated alternating current (AC) static switch circuit with only one IGBT and four auxiliary SCRs in accordance with an illustrative embodiment. In alternative embodiments, fewer, additional, and/or different elements may be present. IGBTs can be higher cost components of the commutation and switch circuits as disclosed herein. Accordingly, reducing the number of IGBTs may lower the cost of the device. A circuit 700 shows an auxiliary commutation circuit that utilizes only one IGBT 735.

The circuit 700 includes an AC static switch of two SCRs 760 and 765 connected in anti-parallel. The circuit 700 also includes a commutation module connected in parallel with the AC static switch. The commutation module includes a terminal 705 on a supply side of the device connected to an anode of an SCR 710 and a cathode side of an SCR 715. A terminal 740 on a load side of the device is connected an anode side of an SCR 745 and a cathode side of an SCR 750. A terminal 725 is connected to a cathode side of the SCR 710, and a cathode side of the SCR 745, and a first side of an IGBT 735. A terminal 720 is connected to an anode side of the SCR 715, and anode side of the SCR 750, and a first side of a voltage source 730. A terminal 755 is connected to a second side of the voltage source 730 and a second side of the IGBT 735.

To produce a commutation pulse that turns off SCR 760, SCR 710 and SCR 750 are gated on along with the IGBT 735. Likewise, SCR 745 and SCR 715 are gated on, along with IGBT 735, when turning off SCR 765. The additional circuit complexity may use isolated drivers for the various SCR gate currents; but these can be small transformers driven by a common pulse driver for the IGBT. The IGBT gate drive and auxiliary commutation capacitor (730) can also share a common isolated power supply. The commutating SCRs (710, 715, 745, and 750) are significantly smaller than the AC switches (SCRs 760 and 765) since they may only conduct load current on the order of 100-300 microseconds (μs). For example, a 500 Amp (A) SCR may have a 14000 A pulse rating for 10 milliseconds. This pulse is sufficient to turn off a current of 8000 A in the static switch. Additional snubber circuitry, such as a snubber 770, is used to protect the IGBT but it may be small in comparison to the commutating components. The snubber 770 includes a resistor and capacitor connected across the IGBT 735. The snubber shown is one possible configuration, other snubber configurations may be used. The snubber 770 functions similarly to the snubbers described above with respect to FIG. 4. A voltage clamp may also be added to this circuit in the same manner as described earlier.

Figure 7B:
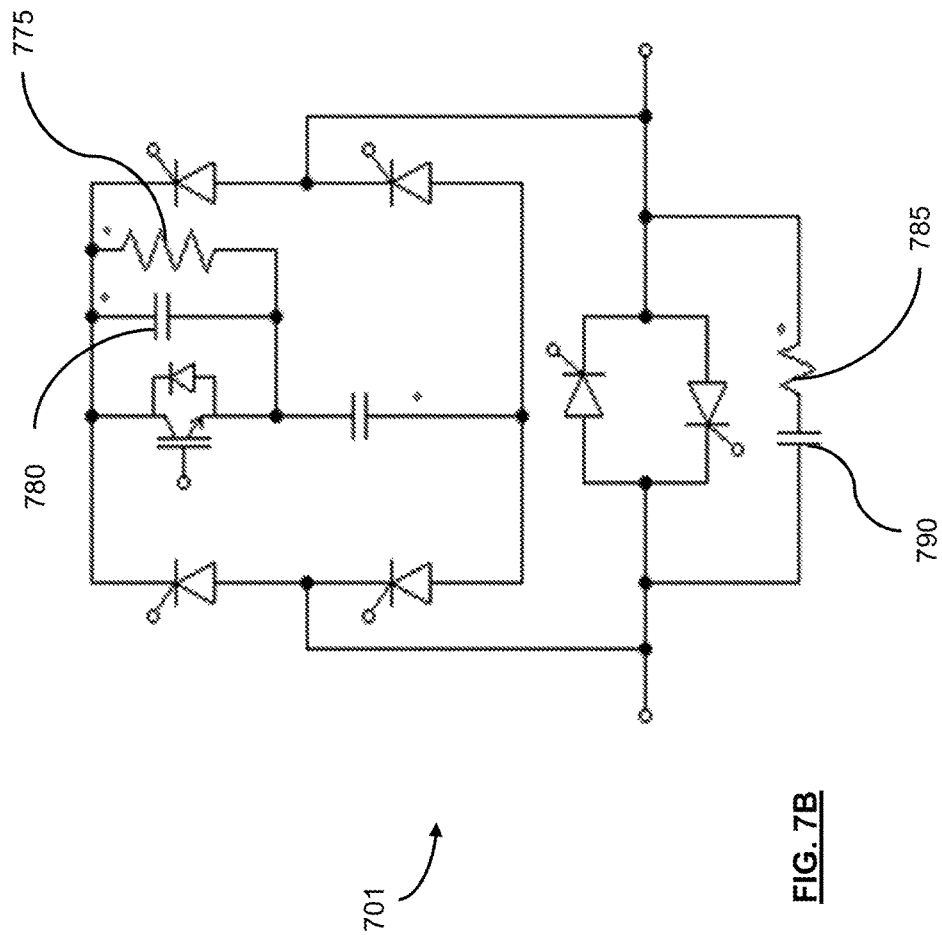
FIG. 7B is a circuit diagram illustrating an alternative auxiliary commutated alternating current (AC) static switch circuit with only one IGBT and four auxiliary SCRs in accordance with an illustrative embodiment.

FIG. 7B is a circuit diagram illustrating an alternative auxiliary commutated alternating current (AC) static switch circuit with only one IGBT and four auxiliary SCRs in accordance with an illustrative embodiment. A circuit 701 is similar to the circuit 700 discussed above, but with different snubber components. For example, instead of the snubber 770 of the circuit 700, the circuit 701 shows a snubber including a resistor 775 and a capacitor 780 connected in parallel. In addition, the circuit 701 includes a snubber across the static switch including a resistor 785 and a capacitor 790 connected in series.

Advantageously, in the systems and methods disclosed herein, commutation is decoupled from inverter operation (i.e., correction signals being applied during at least a portion of a voltage sag or voltage swell). Dynamics associated with parasitic capacitances and inductances between a shunt-connected inverter and an SCR static switch may not affect either the commutation process or an inverter transient response. Another advantage is that commutation time may be consistent regardless of circuit impedances that vary from application to application. Commutation time can also be as fast as in a series dynamic sag correction topology. Commutation can also be more reliable in the present systems because a commutating voltage is independent of voltages and circuit conditions with regard to operating signals and different loads.

FIG. 8 is a graph illustrating simulated voltage results of an auxiliary commutated SCR circuit in an AC static switch configuration delivering power to a resistive load without a voltage clamp in accordance with an illustrative embodiment. In alternative embodiments, fewer, additional, and/or different elements may be present. A line 805 shows input voltage into the device, with a significant inductive spike when the SCR is turned off. A line 810 shows the output voltage of the device when coupled to a shunt-connected inverter configuration, such as shown in FIG. 6. Note that even where the SCR is turned off, there is no large voltage spike in the output.

FIG. 9 is a graph illustrating simulated current results of an auxiliary commutated SCR circuit in an AC static switch configuration delivering power to a resistive load without a voltage clamp in accordance with an illustrative embodiment. In alternative embodiments, fewer, additional, and/or different elements may be present. FIG. 9 corresponds with FIG. 8. A line 905 corresponds to current from the AC supply flowing through the static switch and through the load. A line 910 corresponds to an SCR OFF command. Note that the load current goes to zero just after the SCR OFF command is initiated demonstrating SCR commutation at a non-zero current.

FIG. 10 is a graph illustrating laboratory results of an auxiliary commutated SCR circuit in an AC static switch configuration delivering power to a resistive load without a voltage clamp in accordance with an illustrative embodiment. In alternative embodiments, fewer, additional, and/or different elements may be present. FIG. 10 shows similar data to FIGS. 8 and 9, but is measured, as opposed to simulated, data. A line 1005 shows input voltage with a voltage spike. A line 1010 shows output voltage of the device, when coupled to a shunt-connected inverter configuration, such as shown in FIG. 6, without a large voltage spike. A line 1015 shows the circuit current, and a line 1020 shows the SCR OFF command. Note that the load current goes to zero just after the SCR OFF command is initiated demonstrating SCR commutation at a non-zero current.

FIG. 11 is a graph illustrating simulated voltage results of an auxiliary commutated SCR circuit in an AC static switch configuration delivering power to a resistive load with a voltage clamp (e.g., the voltage clamp of FIG. 5A or 5B) in accordance with an illustrative embodiment. In alternative embodiments, fewer, additional, and/or different elements may be present. FIG. 11 is similar to FIG. 8, but shows simulated results with a voltage clamp. Accordingly, a spike on an input voltage line 1105 is very small compared to the spike in the line 805, because a voltage clamp is present to absorb and dissipate the inductive energy when the SCR is turned off. A line 1110 shows minimal spike on the output voltage as well.

FIG. 12 is a graph illustrating simulated current results of an auxiliary commutated SCR circuit in an AC static switch configuration delivering power to a resistive load with a voltage clamp in accordance with an illustrative embodiment. In alternative embodiments, fewer, additional, and/or different elements may be present. A line 1215 shows the current from the AC supply flowing through the static switch and through the load. A line 1220 shows the SCR OFF command. Note that the load current goes to zero just after the SCR OFF command is initiated demonstrating SCR commutation at a non-zero current.

FIG. 13 is a graph illustrating laboratory results of an auxiliary commutated SCR circuit in an AC static switch configuration delivering power to a resistive load with a voltage clamp in accordance with an illustrative embodiment. In alternative embodiments, fewer, additional, and/or different elements may be present. A line 1305 shows the input voltage into a device. A line 1310 shows the output voltage from a device when coupled to a shunt-connected inverter configuration such as FIG. 6. A line 1315 shows circuit current in the device. A line 1320 shows the SCR OFF command. Note that the load current goes to zero just after the SCR OFF command is initiated demonstrating SCR commutation at a non-zero current. As in FIGS. 11 and 12, FIG. 13 shows that, with a voltage clamp, voltage spikes on the input line voltage from line inductance can be significantly reduced to prevent damage to the circuitry of a voltage sag or voltage swell correction device and load.

Figure 14:
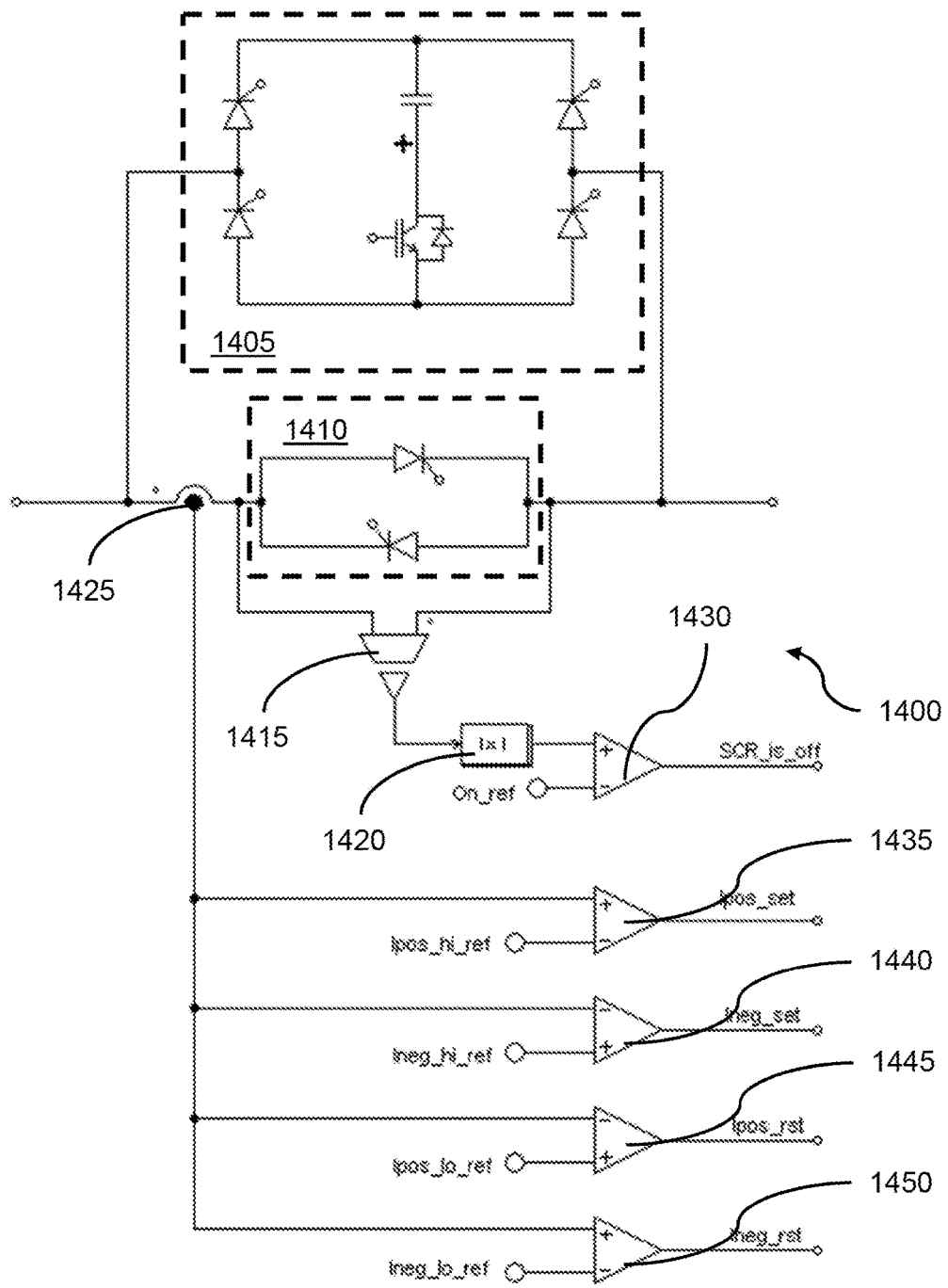
FIG. 14 is a circuit diagram illustrating feedback elements of an auxiliary commutated SCR circuit control in accordance with an illustrative embodiment.

FIG. 14 is a circuit diagram illustrating simplified feedback elements of an auxiliary commutated SCR circuit control in accordance with an illustrative embodiment. In alternative embodiments, fewer, additional, and/or different elements may be present. The circuit 1400 includes an AC static switch 1410 and a commutation module 1405. The circuit 1400 shows a node 1425 that can measure current through the AC static switch. The circuit 1400 also includes a voltage sensor 1415, an absolute value block 1420, and a comparator 1430. The circuit 1400 further includes a current polarity detector comparators 1435, 1440, 1445, and 1450.

Figure 15:
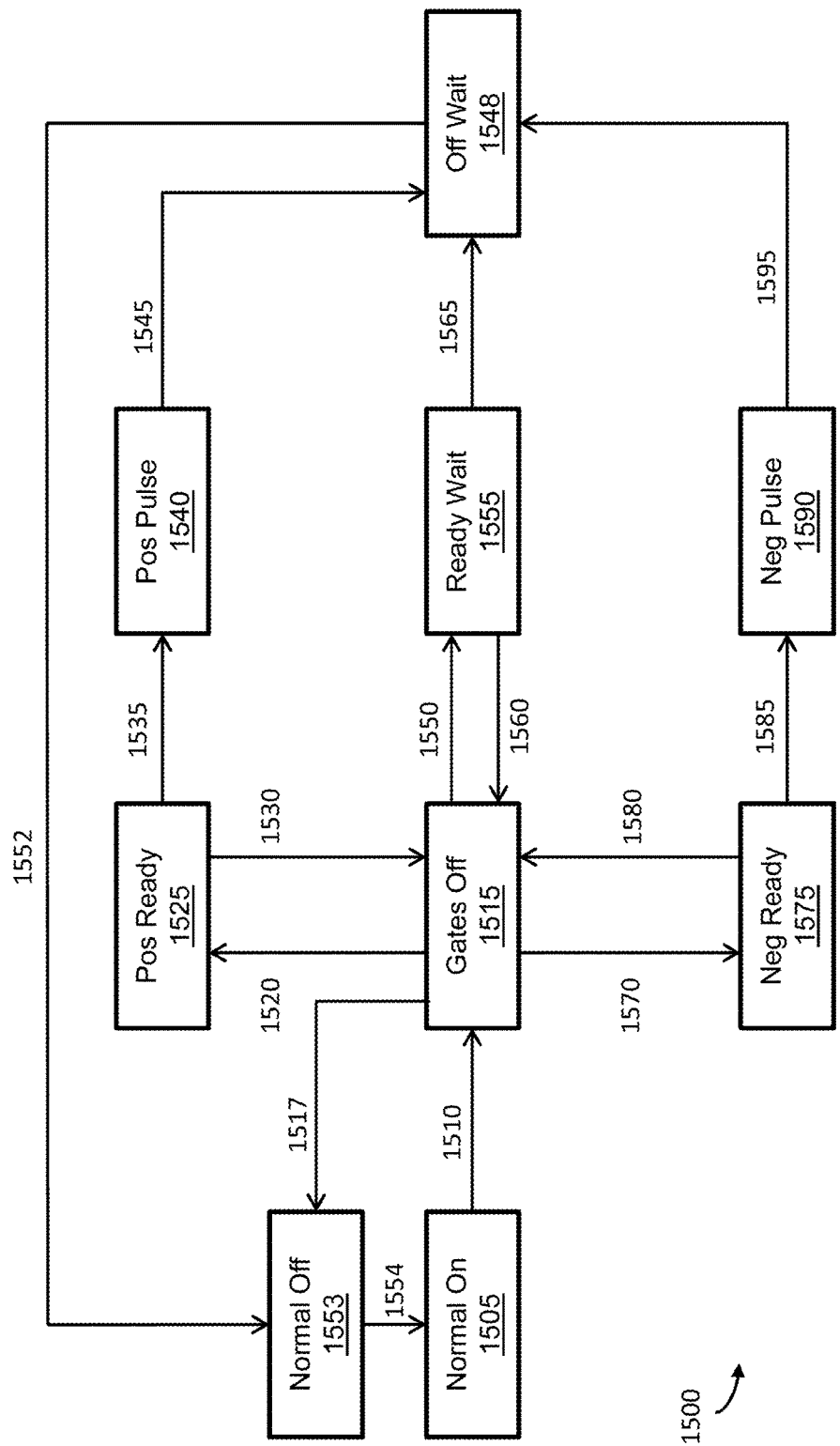
FIG. 15 is a flow chart illustrating an auxiliary commutated SCR circuit control process in accordance with an illustrative embodiment.

FIG. 15 is a flow chart illustrating an auxiliary commutated SCR circuit control process in accordance with an illustrative embodiment. In alternative embodiments, fewer, additional, and/or different operations may be performed. Also, the use of a flow diagram is not meant to be limiting with respect to the order of operations performed. The control state flow chart in FIG. 15 is described below along with the circuit 1400 in FIG. 14. The operations of FIG. 15 correspond to control paths. That is, when an operation between blocks occurs in FIG. 15, the control system is reacting to a certain state of the circuit and controlling the circuit according to the control paths or operations accordingly as described below.

The various elements in the circuit 1400 demonstrate basic auxiliary commutation control function for an AC static switch. In the Normal_On block 1505, the SCR gates in the AC static switch 1410 are provided with continuous current pulses to keep the device active. An SCR OFF command may be asserted at an operation 1510 which sends the controller to the Gates Off state at a block 1515. In this state, the gate current is removed from the SCRs in the AC static switch 1410. However, since current may be generally still flowing through the SCRs (the AC static switch 1410 has not commutated), the AC static switch 1410 may not necessarily stop conducting at this point. Accordingly, the SCRs may be force-commutated off to ensure that the AC static switch 1410 is off. Four measurable SCR current/voltage conditions are possible: 1) positive current is flowing through a first SCR and the static switch voltage is positive and low; 2) negative current is flowing through a second SCR and the static switch voltage is negative and low; 3) both SCRs are off, no current is flowing and the SCR voltage is positive or negative and high (SCRs are off); 4) the SCR current is zero after a natural commutation or below the current polarity detector threshold, but the SCR voltage is too low to indicate whether or not the SCR is off.

When condition 1 is met, the "Ipos_set" comparator 1435 signal is active. In other words, the comparator 1435 indicates that a positive current is above a noise threshold (as compared to a reference current). The "Ipos_set" signal causes an operation 1520 in FIG. 15 to advance the control state to a positive ready block 1525. At the positive ready block 1525, the system is ready to send a commutation pulse to turn off the first SCR. After a sufficient delay time to insure the non-conducting SCR has no current reapplied before its turn-off time has expired, an operation 1535 advances the control state to a positive pulse block 1540, where the positive commutation pulse is applied. After the pulse is applied for the turn off time of the SCR, line 1545 advances the controller to the Off Wait state 1548. Momentarily, the SCR_is_off signal from comparator 1430 should go high indicating the SCR was successfully commutated (operation 1552) and the controller advances to the Normal_Off state 1553. If, for some reason, the SCR does not shut off, the system waits another much longer amount of time, such as 11 milliseconds (greater than 10 milliseconds, the amount of time needed in a 50/60 Hertz (Hz) AC system for the current to cross zero and ensure that the SCRs naturally commutate). After the wait time passes (operation 1552) the controller will advance to the Normal_off state 1553. When it is desired to turn the SCRs back on, operation 1554 advances the controller to the Normal_On block 1505, where the SCR gates in the AC static switch 1410 are again provided with continuous current pulses to keep the device active.

When condition 2 is met, the "Ineg_set" comparator 1440 signal is active. In other words, the comparator 1440 indicates that a negative current is above a noise threshold (as compared to a reference current). The "Ineg_set" signal causes an operation 1570 in FIG. 15 to advance the control state to a negative ready block 1575. At the negative ready block 1575, the system is ready to send a commutation pulse to turn off the second SCR. After a sufficient delay time to insure the non-conducting SCR has no current reapplied before its turn-off time has expired, an operation 1585 advances the control state to a negative pulse block 1590, where the negative commutation pulse is applied. After the pulse is applied for the turn off time of the SCR, line 1595 advances the controller to the Off Wait state 1548. Momentarily, the SCR_is_off signal from comparator 1430 should go high indicating the SCR was successfully commutated (operation 1552) and the controller advances to the Normal_Off state 1553. If for some reason, the SCR does not shut off, the system waits another much longer amount of time, such as 11 milliseconds (greater than 10 milliseconds, the amount of time needed in a 50/60 Hertz (Hz) AC system for the current to cross zero and ensure that the SCRs naturally commutate. After the wait time passes (operation 1552) the controller will advance to the Normal_off state 1553. When it is desired to turn the SCRs back on, operation 1554 advances the controller to the Normal_On block 1505, where the SCR gates in the AC static switch 1410 are again provided with continuous current to keep the device active.

When condition 3 is met, the "SCR_is_off" comparator 1430 is active. In this scenario, the SCRs have turned off naturally without needing a commutation signal. The "SCR_is_off" signal goes high because there is significant voltage detected across the AC static switch. This causes an operation 1550 to advance the control state to a ready wait block 1555. At the block 1555, the system will wait a certain amount of time before an operation 1565 advances the control state to an off wait state block 1548. The amount of time may be the maximum amount of time it would take for an SCR to fully turn off, such as 200 μs. If the "SCR_is_off" signal from comparator 1430 goes inactive during the time the system is at state block 1555, the system will perform an operation 1560 and return to the state block 1515. Since the SCR_is_off signal from comparator 1430 is already high indicating the SCR was successfully commutated (operation 1552) the controller should immediately advance to the Normal_Off state 1553. If for some reason, the SCR_is_off signal has gone inactive, the system waits another much longer amount of time, such as 11 milliseconds (greater than 10 milliseconds, the amount of time needed in a 50/60 Hertz (Hz) AC system for the current to cross zero and ensure that the SCRs naturally commutate. After the wait time passes (operation 1552) the controller will advance to the Normal_off state 1553. When it is desired to turn the SCRs back on, operation 1554 advances the controller to the Normal_On block 1505, where the SCR gates in the AC static switch 1410 are again provided with continuous current to keep the device active.

If conditions 1, 2, or 3 do not occur after a waiting period such as 22 milliseconds for example, condition 4 is implied. Once the waiting period transpires, an operation 1517 advances the controller to the state to the Normal_Off state block 1553. When it is desired to turn the SCRs back on, operation 1554 advances the controller to the Normal_On block 1505, where the SCR gates in the AC static switch 1410 are again provided with continuous current to keep the device active.

As noted above, if condition 1 is met the controller knows that an auxiliary commutation voltage should be applied in the direction of reverse biasing the first SCR and advances to state "Pos Ready" at state block 1525. If condition 2 is met, the controller moves to "Neg Ready" at state block 1575 to prepare to reverse bias for the second SCR. If condition 3 is met, the SCRs are already off or have naturally commutated and do not require an auxiliary commutation and the controller advances to "Ready Wait" at state block 1555.

The first three cases, the conditions 1, 2, or 3, must persist for the Tq time of the particular SCRs used (e.g., 200 μs) to insure that the non-conducting SCR has been non-conducting for the Tq time, i.e., the time interval required after forward current has decreased to zero for the specific SCR device to recover capability to block its rated voltage. If this time condition has not been met, the non-conducting SCR may turn back on when the auxiliary commutation voltage is applied because it would see a forward bias before it is completely off.

For example, given an AC current in the static switch, assume the second SCR had been conducting current, and that both the first and second SCRs had been provided with continuous gate current, just prior to the command to turn off the SCRs. Then, further assume that the AC current in the static switch passes through zero and the first SCR just starts to conduct. Finally, assume that the SCR off command is asserted at a time less than its Tq time after the second SCR stopped conducting. In this case, the Ipos_set signal from comparator 1435 goes high indicating a positive commutation voltage should be applied. If acted upon immediately, the IGBT and auxiliary SCRs would be gated on to apply the commutation voltage needed to reverse bias the first SCR. However, at the same time, the second SCR would be forward biased by that same commutation voltage. Since the second SCR cannot block forward voltage until its Tq time has elapsed, the second SCR may begin conducting resulting in a short circuit of the commutation circuit. Very large currents may flow through the second SCR resulting in potential circuit damage or minimally, delayed static switch commutation.

As explained above, in each of the "Ready" states (positive, negative, and ready wait), the circuit should remain in a stable state for the Tq time (e.g., 200 μs) before the commutation pulse is actually applied. If the current direction changes or the "SCR_is_off" status changes within the Tq time, the controller reverts back to the "Gates Off" state until another circuit condition drives it to one of the "Ready" states for a stable amount of time. For example, at an operation 1580, an "Ineg_rst" signal from the comparator 1450 is active causing the system to revert to gates off state block 1515. In another example, at an operation 1530, an "Ipos_rst" signal from the comparator 1445 is active causing the system to revert to gates off state block 1515.

Given a stable "Pos Ready" or "Neg Ready" state at state blocks 1525 or 1575, respectively, the controller will advance to the respective "Pos Pulse" or "Neg Pulse" state blocks 1540 or 1590 with operations 1535 or 1585 respectively, and apply the required commutation pulse polarity by turning on the IGBT and the appropriate auxiliary SCRs for an additional time period of Tq. This is to ensure that the device being commutated has sufficient time to turn off completely while reversed biased by the auxiliary commutation pulse. If the SCR current is not high enough to trigger the "Ipos_set" or "Ineg_set" comparators and advance to state blocks 1525 or 1575, the SCRs will eventually naturally commutate as the AC current passes through zero, and subsequent AC circuit voltage will trigger the "SCR_is_off" comparator and advance the controller to "Ready Wait" state block 1555.

If the SCRs turn off but the circuit voltage is too low to trigger the "SCR_is_off" comparator, the controller has a time out condition which forces an exit of the "Gates Off" state at state block 1515. The timeout period may, for example, be set at 22 milliseconds under the assumption that in a 50/60 Hz AC circuit, the current will cross zero and naturally commutate in both directions in no more than 20 ms. The time out function will allow the controller to exit the "Gates Off" state if circuit currents and voltages are uncharacteristically low. Such a time out will activate an operation 1517 and take the system back to the Normal_Off state block 1553.

If the controller has not timed out as described above, it may unconditionally advance to the "Off Wait" state 1548 after the Tq time. Typically the "SCR_is_off" comparator signals immediately after the commutation pulse and the controller exits the "Off Wait" state signifying the end of the commutation cycle. If for some reason, the commutation failed or the circuit voltage is too low to indicate the SCR is off, there is another time out condition, for example an 11 ms time out condition, that allows the controller to exit the state 1548 (under the same assumption above that a natural commutation will have occurred within 10 ms or less).

Figure 16:
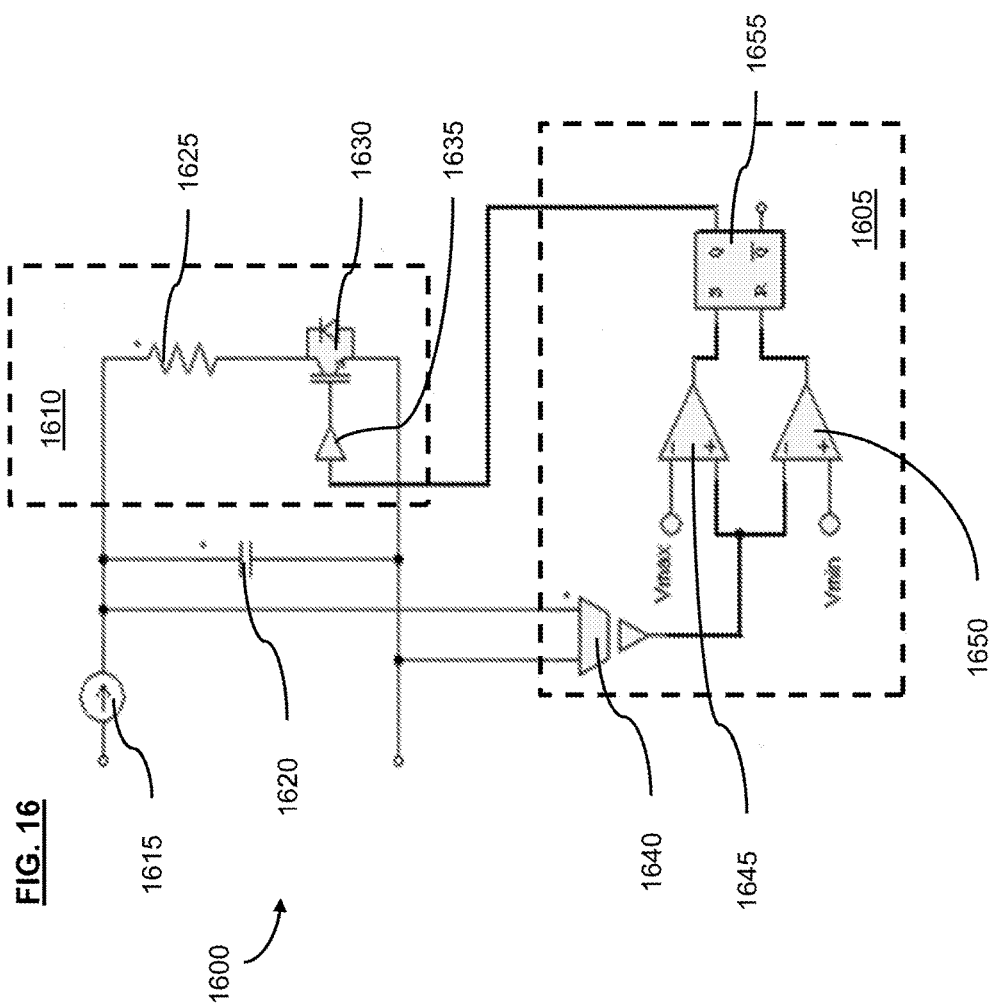
FIG. 16 is a circuit diagram illustrating a dynamic brake for an auxiliary commutated SCR circuit in accordance with an illustrative embodiment.

FIG. 16 is a circuit diagram illustrating a dynamic brake for an auxiliary commutated SCR circuit in accordance with an illustrative embodiment. In alternative embodiments, fewer, additional, and/or different elements may be present. The circuit 1600 shows a dynamic brake power circuit 1610 that can be used to dissipate energy from the voltage clamp, a direct current (DC) bus 1620 is charged by parasitic inductive energy represented by a current source 1615. The energy dissipated can be turned into heat by a dynamic brake. Since the dynamic brake dissipates energy in conjunction with the voltage clamp, lower capacitances may be used in the voltage clamp circuit. The dynamic brake power circuit 1610 can be shut on and off based on voltage hysteresis as shown in the dynamic brake control block 1605.

In another illustrative embodiment, auxiliary commutated SCR technology may be utilized in voltage sag testing in which a voltage sag is generated by switching from nominal line voltage to a reduced voltage tap on a transformer. Contactor-based switching voltage sag generators may be slow, with long open transitions (exceeding one cycle) between tap changes. These types of testers may switch at random phase angles but the particular angle is unpredictable, which may be undesirable. Sag generators that use SCRs in an AC static switch configuration may have shorter open transitions but may only switch at current zeros and also not perform phase-angle control. An auxiliary commutated solution may provide a predictable turn-off time for phase angle control and allow the tap-changing open transition dead time to be significantly reduced. For example, auxiliary commutated SCR AC static switches may be used with different sources to control exactly when a signal applied to a load is switched to a different source. In another embodiment, multiple auxiliary commutated SCR static switches may tap a transformer in different locations, therefore allowing a quick switch between locations of drawing a signal from a transformer. Such embodiments may offer advantages in voltage sag testing.

Advantageously, disclosed herein are improved auxiliary commutated SCR circuits. Such circuits may be used in voltage sag or swell detection and/or correction as disclosed herein throughout. The circuits disclosed herein can reduce the number of components used in auxiliary commutated SCR circuits, reduce the complexity of the circuits, and provide a cheaper and more reliable circuit for auxiliary commutated SCR circuits. In particular, various configurations and embodiments for voltage clamp(s) for use in auxiliary commutated SCR circuits are disclosed herein. As disclosed above (e.g., with respect to FIGS. 7A and 7B), a voltage clamp can be used in an auxiliary commutated SCR circuit (e.g. FIGS. 5A, 5B, and associated description above) such as the AC static switch circuits disclosed herein (e.g., FIGS. 3A, 3B, 7A and associated description above).

In some scenarios, current surges of significant magnitude could potentially damage voltage clamp circuit components, in particular during a power up of the SCRs in an AC static switch circuit. Advantageously, disclosed herein are illustrative embodiments for protecting voltage clamp components during power-up sequences. Various embodiments disclosed herein include embodiments with switches to prevent a current surge from the main supply through the switch during power up, and where voltage clamp components are charged before power up (turning on) an AC static switch circuit. Other embodiments include embodiments without switches to prevent a current surge from the main supply through the switch during power up, where the voltage clamp components can be charged simultaneously with power up (turning on) of the AC static switch circuit (i.e., when a load is connected to a circuit at the same time supply power is applied to the system).

Figure 17:
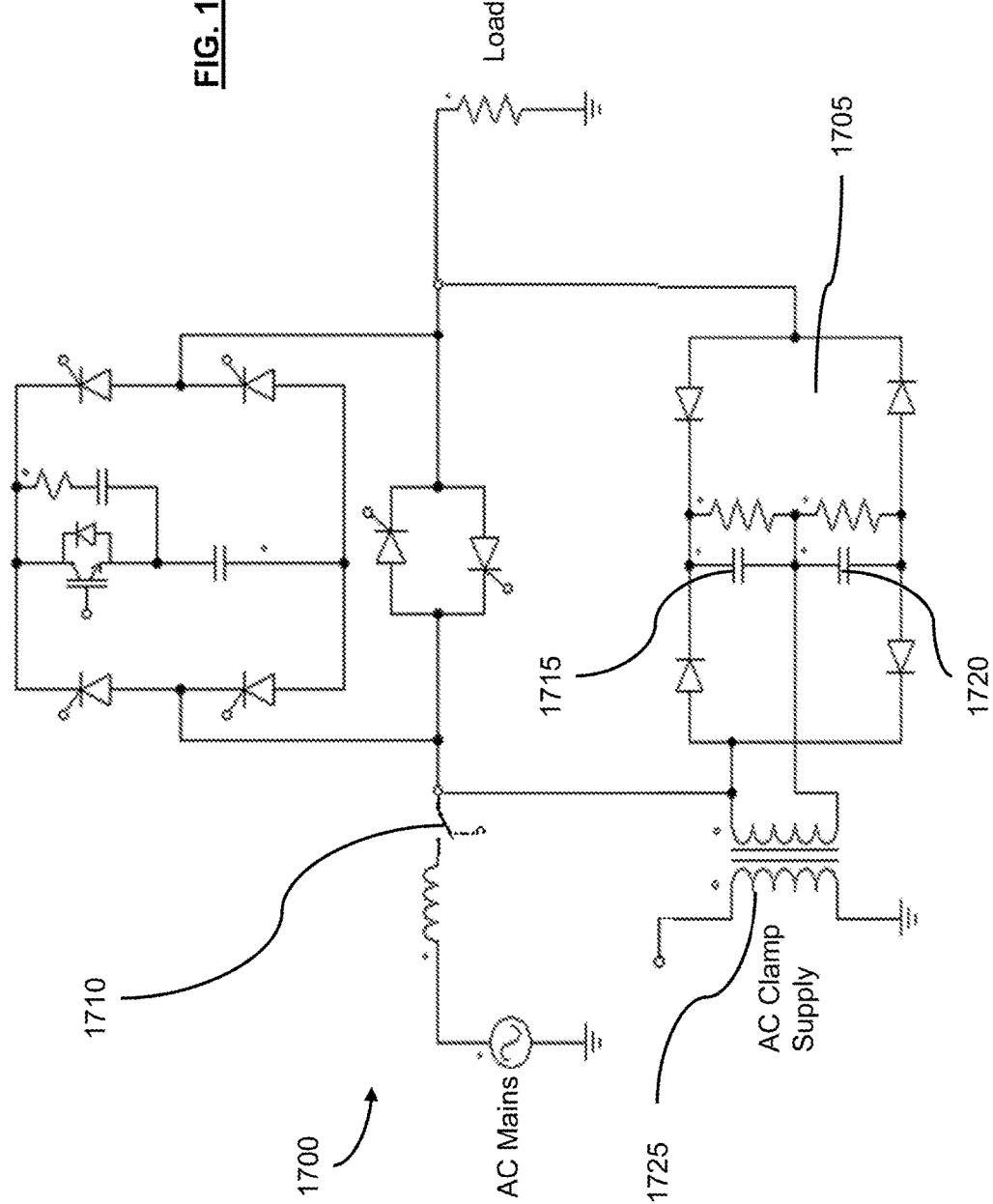
FIG. 17 is a circuit diagram illustrating an auxiliary commutated alternating current (AC) static switch circuit with only one IGBT and four auxiliary SCRs and a voltage clamp in accordance with an illustrative embodiment.

FIG. 17 is a circuit diagram illustrating an auxiliary commutated alternating current (AC) static switch circuit with only one IGBT and four auxiliary SCRs and a voltage clamp in accordance with an illustrative embodiment. In alternative embodiments, fewer, additional, and/or different elements may be present. FIG. 17 shows an auxiliary commutated SCR circuit that can be used as an AC static switch similar to that shown in FIG. 7A and discussed above.

Additionally, the static switch circuit 1700 includes a voltage clamp 1705 similar to the voltage clamp shown in FIG. 5B and discussed above. Capacitors (also referred to herein as voltage sources) 1715 and 1720 of the voltage clamp 1705 can be charged by an AC clamp supply transformer 1725 to prevent a current surge from the AC mains (which provides the supply power/operating signal) powering on the AC static switch from entering and damaging the capacitors 1715 and 1720. In order to prevent the current surge during the charging of the capacitors 1715 and 1720, a switch 1710 is open during the charging. Once the capacitors 1715 and 1720 are charged by the AC clamp supply transformer 1725, the switch 1710 is closed and the operating signal from the AC Mains can supply the load, and the auxiliary commutated SCR circuit can function to commutate the SCRs off when, for example, a voltage sag or swell is detected as disclosed herein.

If the load is connected to the circuit as shown and the AC mains supply switch 1710 is closed before the capacitor 1715 and the capacitor 1720 are charged and before the main SCRs of the static switch are closed, load current will flow through the clamp and charge the capacitor 1715 and the capacitor 1720. If the load is small (with a high impedance), the clamp current will also be relatively small and this will not likely cause any undue stress on the clamp components. However, it is possible that the load might be a transformer (or other low impedance device) which is subject to extremely high inrush currents upon power up. If such inrush currents flow through the clamp circuit they may cause diode or capacitor failure for example, or, if a fuse is supplied in the clamp circuit, the fuse may open rendering the rest of the auxiliary commutation SCR circuit unable to operate safely such that energy can be properly dissipated through the voltage clamp 1705.

Accordingly, a safe power-up method provides for the voltage clamp circuit 1705 be pre-charged before the switch 1710 is closed to provide main AC power to the load. Further, the gate power for the main SCRs in the static switch is available before the closure of the switch 1710 (although this is not strictly necessary, for example when the clamp is pre-charged). Accordingly, if the main SCRs are gated on before the switch 1710 is closed, the voltage clamp circuit 1705 may be charged after the switch 1710 is closed.

This method using a switch and an AC voltage clamp supply transformer to charge a voltage clamp also works for other described embodiments below and shown in FIGS. 18 and 19.

Figure 18:
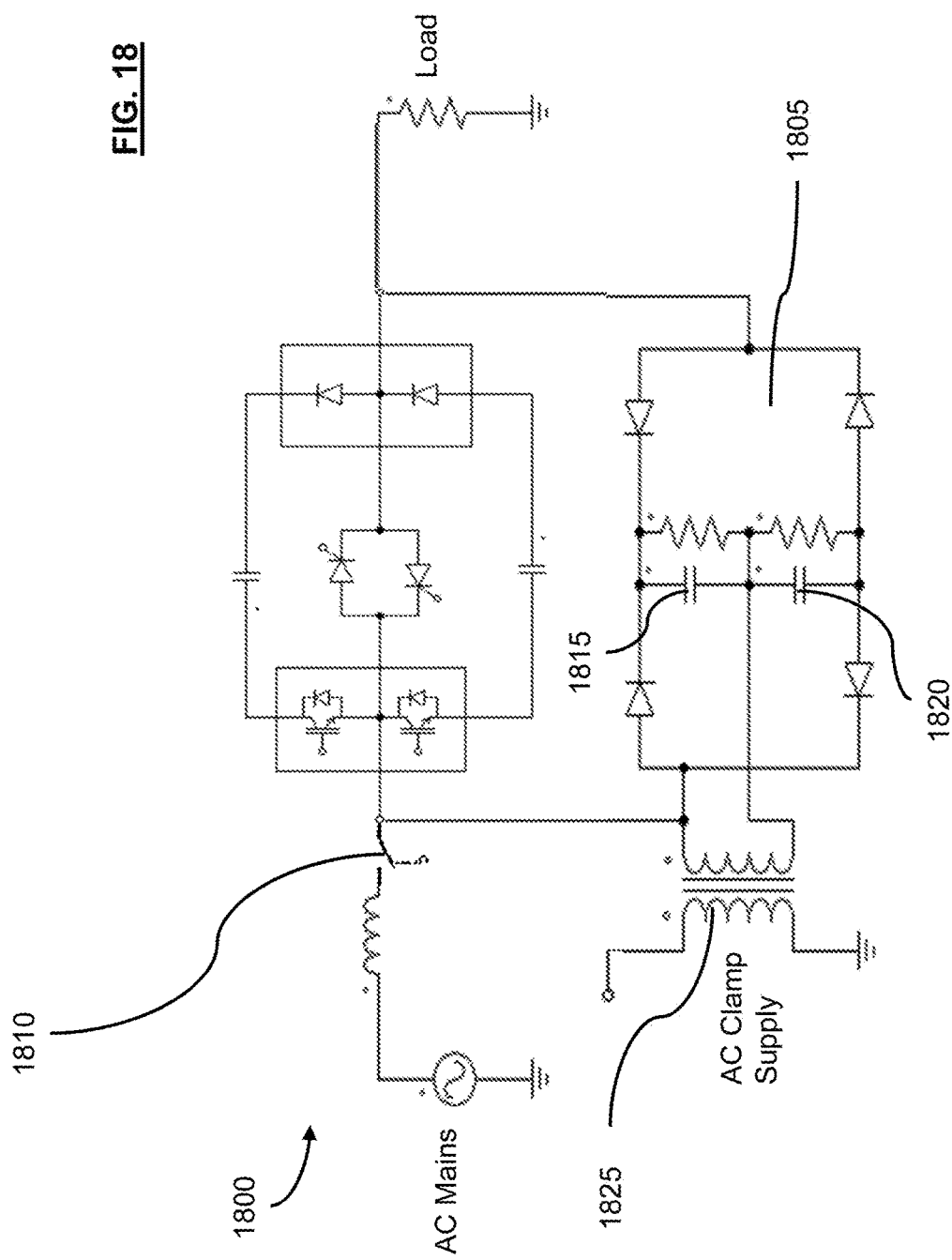
FIG. 18 is a circuit diagram illustrating an auxiliary commutated alternating current (AC) static switch circuit with paired self-commutating semiconductor switches and diodes and a voltage clamp in accordance with an illustrative embodiment.

FIG. 18 is a circuit diagram illustrating an auxiliary commutated alternating current (AC) static switch circuit 1800 with paired self-commutating semiconductor switches and diodes and a voltage clamp in accordance with an illustrative embodiment. In alternative embodiments, fewer, additional, and/or different elements may be present. FIG. 18 shows an auxiliary commutated SCR circuit that can be used as an AC static switch similar to that shown in FIG. 3B and discussed above.

Additionally, the static switch circuit 1800 includes a voltage clamp 1805 similar to the voltage clamp shown in FIG. 5B and discussed above. Capacitors (also referred to herein as voltage sources) 1815 and 1820 of the voltage clamp 1805 can be charged by an AC clamp supply transformer 1825 to prevent a current surge from the AC mains (which provides the supply power/operating signal) powering on the AC static switch from entering and damaging the capacitors 1815 and 1820. In order to prevent the current surge during the charging of the capacitors 1815 and 1820, a switch 1810 is open during the charging. Once the capacitors 1815 and 1820 are charged by the AC clamp supply transformer 1825, the switch 1810 is closed and the operating signal from the AC Mains can supply the load, and the auxiliary commutated SCR circuit can function to commutate the SCRs off when, for example, a voltage sag or swell is detected as disclosed herein.

Figure 19:
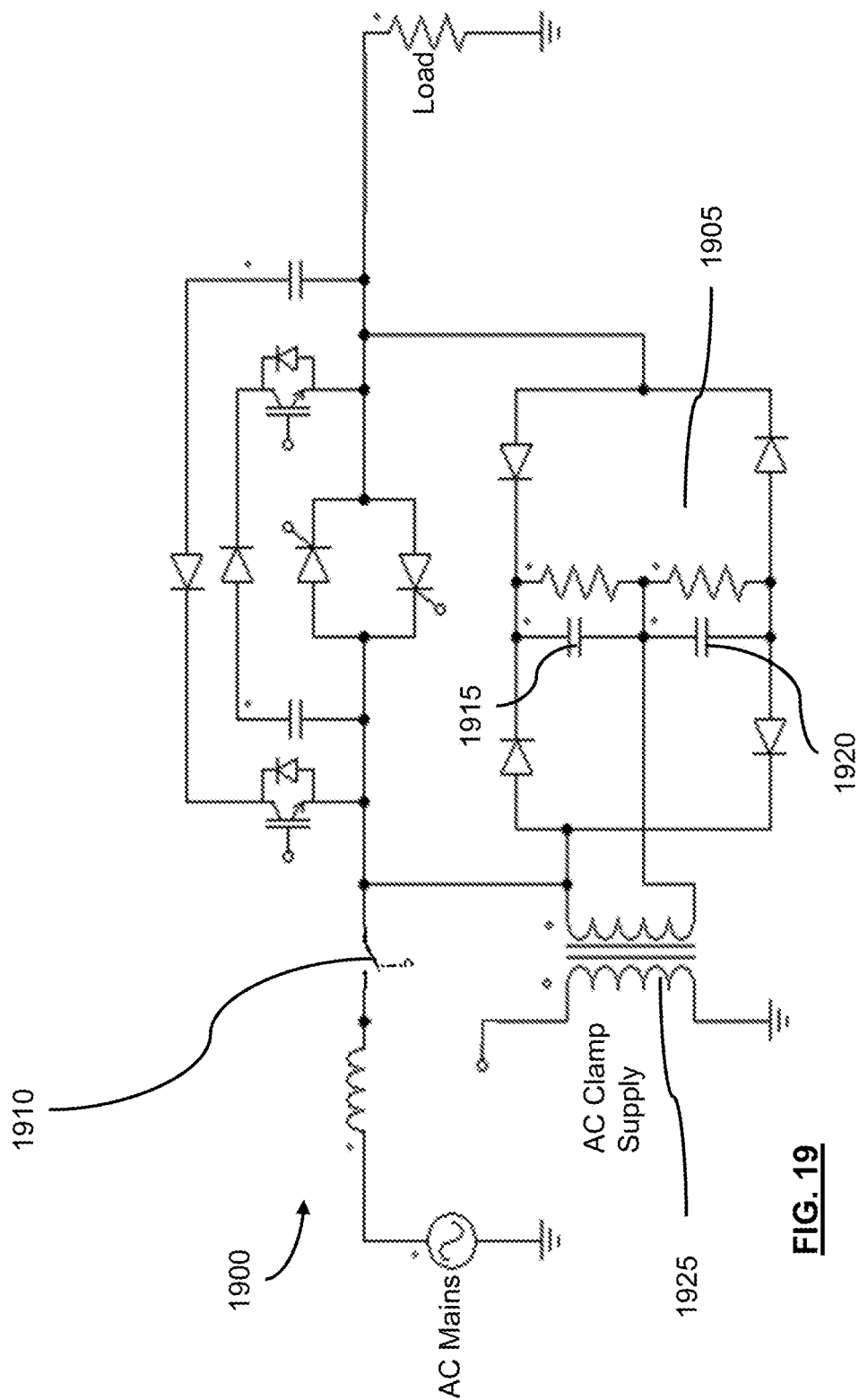
FIG. 19 is a circuit diagram illustrating an auxiliary commutated alternating current (AC) static switch circuit and a voltage clamp in accordance with an illustrative embodiment.

FIG. 19 is a circuit diagram illustrating an auxiliary commutated alternating current (AC) static switch circuit and a voltage clamp in accordance with an illustrative embodiment. In alternative embodiments, fewer, additional, and/or different elements may be present. FIG. 19 shows an auxiliary commutated SCR circuit that can be used as an AC static switch similar to that shown in FIG. 3A and discussed above.

Additionally, the static switch circuit 1900 includes a voltage clamp 1905 similar to the voltage clamp shown in FIG. 5B and discussed above. Capacitors (also referred to herein as voltage sources) 1915 and 1920 of the voltage clamp 1905 can be charged by an AC clamp supply transformer 1925 to prevent a current surge from the AC mains (which provides the supply power/operating signal) powering on the AC static switch from entering and damaging the capacitors 1915 and 1920. In order to prevent the current surge during the charging of the capacitors 1915 and 1920, a switch 1910 is open during the charging. Once the capacitors 1915 and 1920 are charged by the AC clamp supply transformer 1925, the switch 1910 is closed and the operating signal from the AC Mains can supply the load, and the auxiliary commutated SCR circuit can function to commutate the SCRs off when, for example, a voltage sag or swell is detected as disclosed herein.

Accordingly, as discussed above, providing an AC static switch with a switch, transformer, and AC voltage clamp power supply allows the system to charge the voltage clamp before connecting a load to the AC mains power supply to prevent a current surge from the AC mains power supply when the AC static switch is powered on.

Advantageously, additional embodiments disclosed herein can safely charge a voltage clamp to avoid current surges without the use of a switch (e.g. switches 1710, 1810, 1910) or an AC clamp supply power (e.g., shown in FIGS. 17-19). Such embodiments advantageously use fewer components. Additionally, such embodiments do not use a control power for the opening and/or closing of a switch (e.g. switches 1710, 1810, 1910). Such embodiments further reduce the cost, size, and complexity of the AC static switches disclosed herein.

In the embodiments disclosed below, a voltage clamp can be charged simultaneously or nearly simultaneously with powering on an AC static switch (and subsequently connecting a load to an operating signal). Accordingly, the voltage clamp can be charged as one of the main SCRs of a static switch are powered on. In other words, the embodiments disclosed below do not utilize a separate charging step, but rather the charging of the voltage clamp can be done along with powering on the AC static switch. Thus, switches such as switches 1710, 1810, 1910 in FIGS. 17-19 may be omitted. Additionally, such charging may use power (also referred to as the operating signal) from AC mains rather than a separate AC voltage clamp power supply. Accordingly, the embodiments described below with respect to FIGS. 20-22 have an auxiliary commutated static switch circuit that is able to power up a load without any pre-charging or pre-existing control power.

Figure 20:
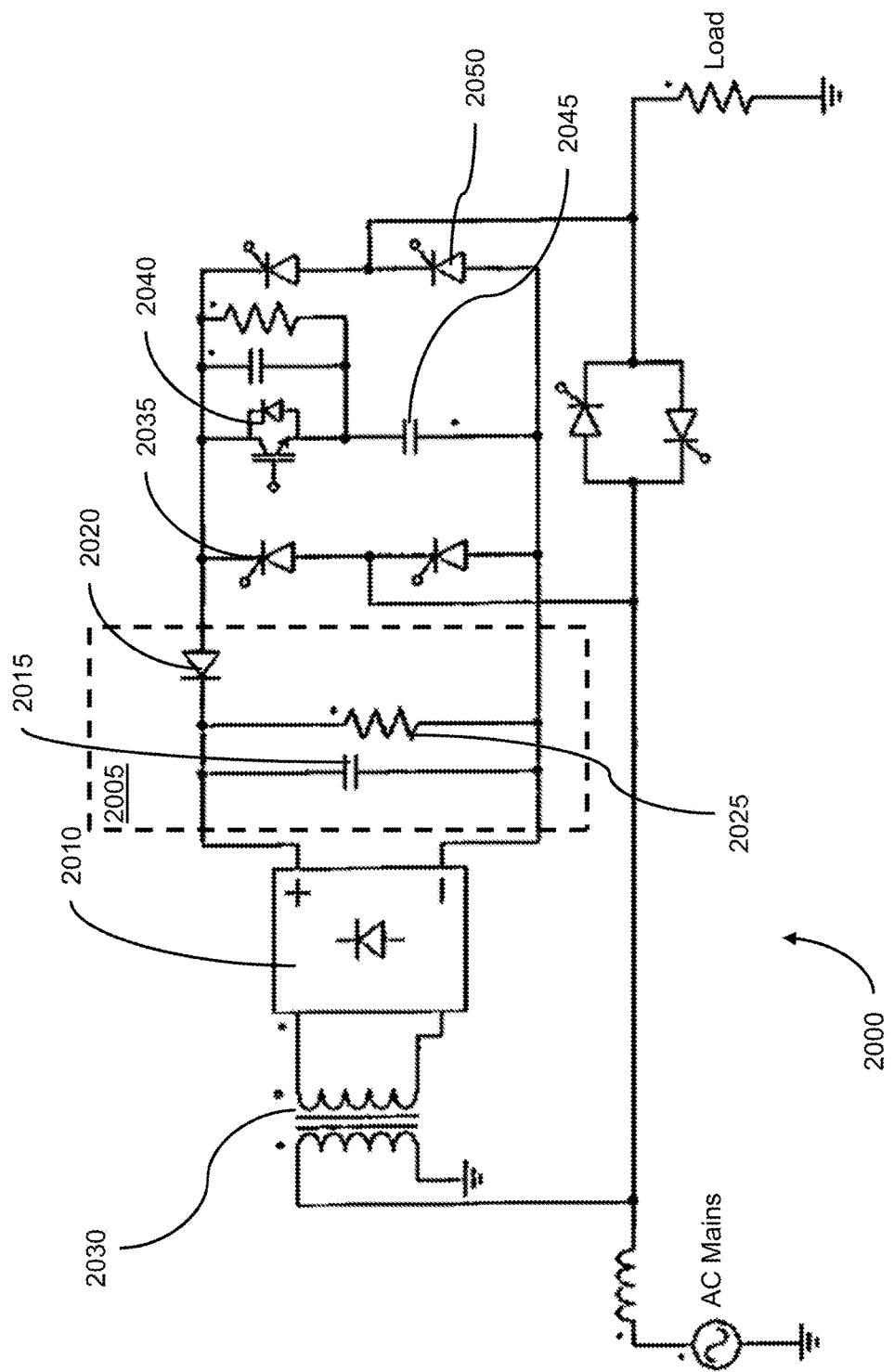
FIG. 20 is a circuit diagram illustrating a switch utilizing a voltage clamp with a reduced number of diodes in accordance with an illustrative embodiment.

FIG. 20 is a circuit diagram illustrating a switch utilizing a voltage clamp with a reduced number of diodes in accordance with an illustrative embodiment. In alternative embodiments, fewer, additional, and/or different elements may be present. FIG. 20 shows an auxiliary commutated SCR circuit that can be used as an AC static switch similar to that shown in FIGS. 7A and 17 as discussed above, except that a voltage clamp 2005 is configured differently to offer advantages discussed herein.

In FIG. 20, the voltage clamp 2005 has been relocated (as compared to the voltage clamps of FIGS. 17-19) across the auxiliary SCR bridge and uses only one clamp diode 2020 as opposed to four diodes in the FIGS. 5B and 17-19. A diode bridge 2010 is also used, but can be small in comparison to the main power circuit. For example, an 800 Amp (A) static switch circuit may use <5 A rated transformer 2030 and diode bridge 2010 because the clamp power supply from the transformer 2030 charges clamp capacitor(s), here clamp capacitor 2015, and is not necessarily used to deliver any continuous power (except for potentially to a high resistance bleeder resistor 2025 shown across the capacitor 2015). Also, that the clamp power supply is sourced by the mains supply and does not use a separate pre-charging supply (as in FIGS. 17-19, for example).

Accordingly, the voltage clamp 2005 is no longer in the main circuit path. The auxiliary SCRs in the commutation module are gated off and block current from flowing through the commutation module into the clamp on power up As discussed above, the voltage clamp 2005 includes the diode 2020, a voltage source or capacitor 2015, and a resistance 2025. The capacitor 2015 and the resistance 2025 are connected in parallel to each other and to the output of the diode bridge 2010. The input of the diode bridge 2010 is connected to the transformer 2030. The capacitor 2015 and the resistance 2025 are further connected on one side of each of the capacitor 2015 and the resistance 2025 to a cathode side of the diode 2020. An anode side of the diode 2020 is connected to a terminal of the commutation module of the circuit 2000. The side of each of the capacitor 2015 and the resistance 2025 that is not connected to the diode 2020 is connected to a different terminal of the commutation module.

In a clamping operation, energy is dissipated through the voltage clamp when the SCR static switch is commutated off. The SCRs can be commutated off as disclosed herein throughout the specification. For example, when positive current is flowing through the AC static switch from the AC mains, and the appropriate SCR of the static switch is commutated off, current flows through an SCR 2035, an IGBT 2040, a capacitor 2045, and an SCR 2050 when the commutation is in process. At this time, the commutation IGBT 2040 is on. Current then transfers from the IGBT 2040 path to the clamp path after a successful commutation of the positive main SCR. Accordingly, current flows through the SCR 2035, the diode 2020, the capacitor 2015, and the SCR 2050 during a clamping action. After the voltage clamp 2005 current decays to zero, the auxiliary SCRs 2035 and 2050 are naturally commutated and resume blocking current again. A similar process can occur for negative current and commutation during a negative current flow to the load of circuit 2000.

Figure 21:
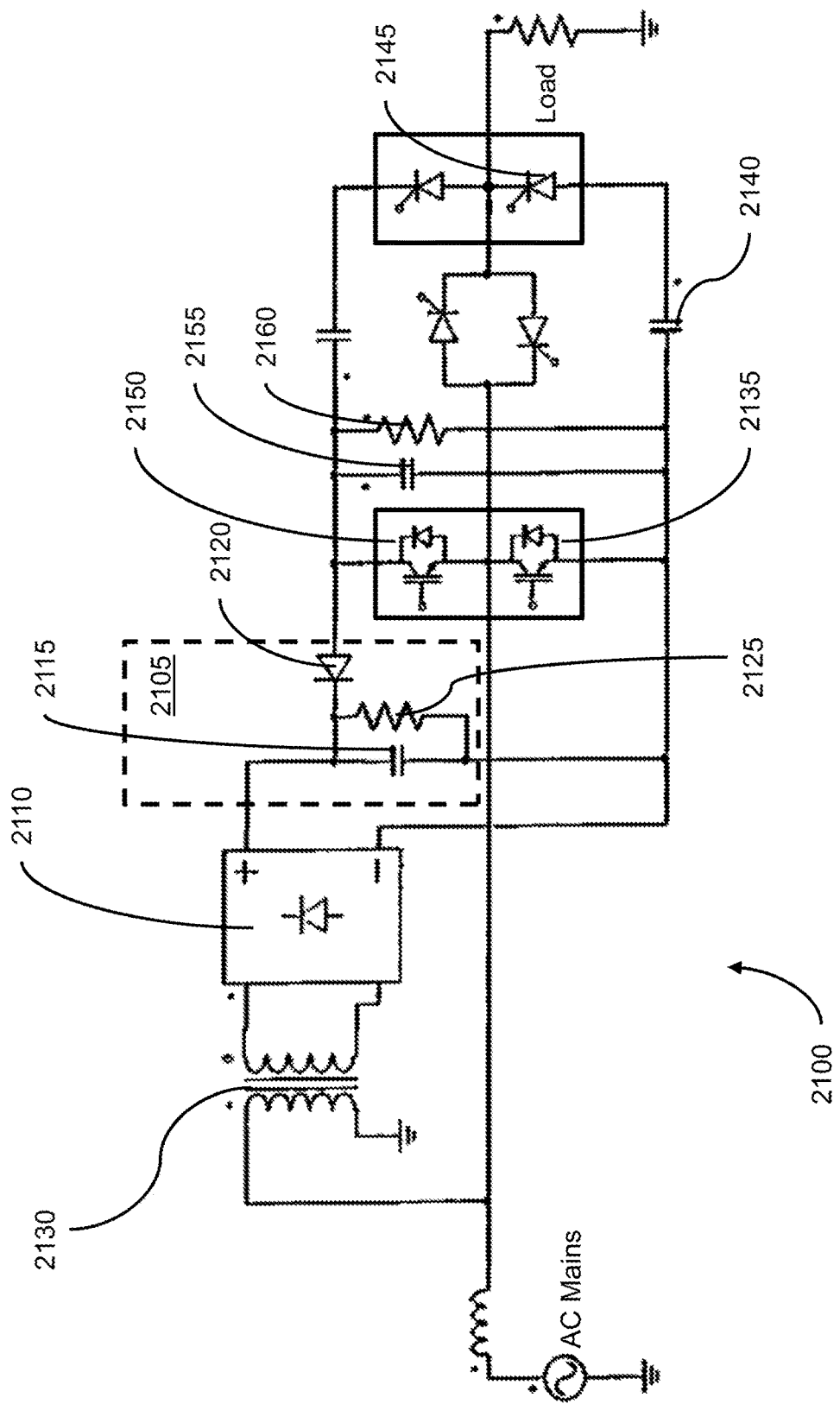
FIG. 21 is a circuit diagram illustrating a switch utilizing a voltage clamp with dual semiconductor devices and a reduced number of diodes in accordance with an illustrative embodiment.

FIG. 21 is a circuit diagram illustrating a switch utilizing a voltage clamp with dual semiconductor devices and a reduced number of diodes in accordance with an illustrative embodiment. In alternative embodiments, fewer, additional, and/or different elements may be present. FIG. 21 shows an auxiliary commutated SCR circuit that can be used as an AC static switch similar to that shown in FIGS. 3B and 18 as discussed above, except that a voltage clamp 2105 is configured differently to offer advantages discussed herein. Circuit 2100 uses dual semiconductor devices. Additionally, what was previously a dual diode block in FIGS. 3B and 18 is now a dual SCR block in order to provide current blocking during power up and is analogous to the SCRs of the commutation module in FIG. 20 discussed above. Similarly, an appropriate SCR of the dual SCR block is gated on at the same time as a respective commutation IGBT is gated as discussed below. The SCR remains conducting as the IGBT is gated off and current transfers to a voltage clamp 2105.

The voltage clamp 2105 functions similarly to the voltage clamp 2005 described above with respect to FIG. 20 and includes a diode 2120, a voltage source or capacitor 2115, and a resistance 2125. The capacitor 2105 and the resistance 2125 are connected in parallel to each other and to the output of a diode bridge 2110. The input of the diode bridge 2110 is connected to a transformer 2130. The capacitor 2115 and the resistance 2125 are further connected on one side of each of the capacitor 2115 and the resistance 2125 to a cathode side of the diode 2120. An anode side of the diode 2120 is connected to a terminal of the commutation module of the circuit 2100 associated with a collector side of a first self-commutating semiconductor switch such as an IGBT antiparallel diode 2150 of the IGBT pair block. The side of each of the capacitor 2115 and the resistance 2125 that is not connected to the diode 2120 is connected to a different terminal of the commutation module associated with an emitter side of a second self-commutating semiconductor switch such as an IGBT 2135. In addition a capacitor 2155 and a resistance 2160 are connected in parallel to each other and to the IGBT pair block. The capacitor 2155 and the resistance 2160 function as a snubber as disclosed herein, for example with respect to snubber components of FIG. 4.

In a clamping operation, energy is dissipated through the voltage clamp when the SCR static switch is commutated off. The SCRs can be commutated off as disclosed herein throughout the specification. For example, when positive current is flowing through the AC static switch from the AC mains, and the appropriate SCR of the static switch is commutated off, current flows through an IGBT 2135 of the IGBT pair block, a capacitor 2140, and an SCR 2145 of the SCR pair block when the commutation is in process. At this time, the commutation IGBT 2135 is on. Current then transfers from the IGBT 2135 path to the clamp path after a successful commutation of the positive main SCR. Accordingly, current flows through the IGBT antiparallel diode 2150 of the IGBT pair block, the diode 2120, the capacitor 2115, the capacitor 2140, and the SCR 2145 of the SCR pair block during a clamping action. After the voltage clamp 2105 current decays to zero, the auxiliary SCRs of the dual SCR pair block are naturally commutated and resume blocking current again. A similar process can occur for negative current and commutation during a negative current flow to the load of circuit 2100.

Figure 22:
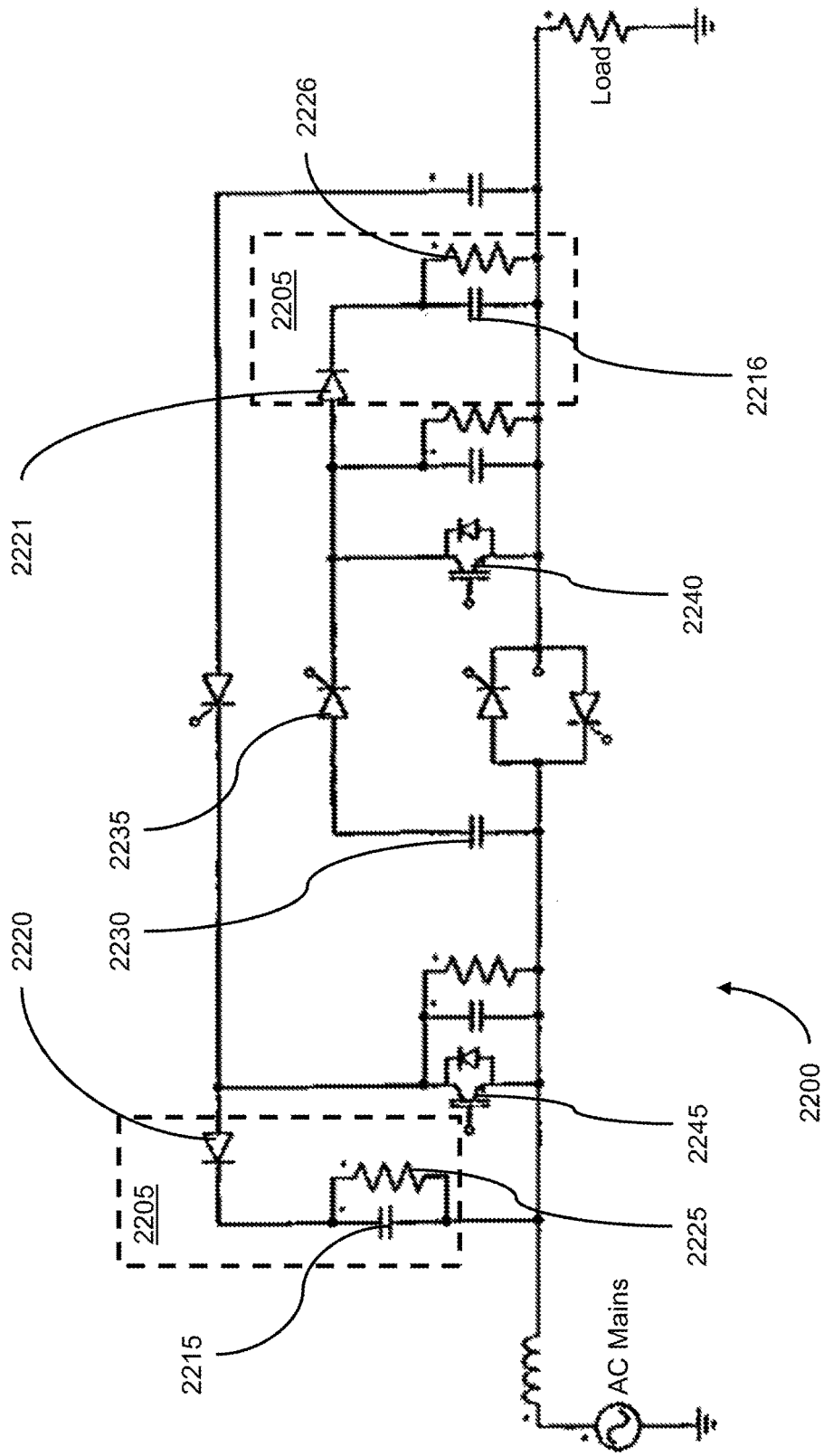
FIG. 22 is a circuit diagram illustrating a switch utilizing a voltage clamp with independent semiconductor devices and a reduced number of diodes in accordance with an illustrative embodiment.

FIG. 22 is a circuit diagram illustrating a switch utilizing a voltage clamp with independent semiconductor devices and a reduced number of diodes in accordance with an illustrative embodiment. In alternative embodiments, fewer, additional, and/or different elements may be present. FIG. 22 shows an auxiliary commutated SCR circuit that can be used as an AC static switch similar to that shown in FIGS. 3A and 19 as discussed above, except that a voltage clamp 2205 is configured differently to offer advantages discussed herein.

The circuit 2200 uses independent semiconductor devices. The voltage clamp 2205 uses two clamp charging transformers and rectifiers (diode bridges) that are omitted from FIG. 22 for clarity, but used in a manner similar to the transformers and diode bridges of FIGS. 20 and 21 and discussed above. In addition to a change in clamp connections, note that what were previously diodes in the commutation modules of FIGS. 3A and 19 are now SCRs. This is to provide current blocking during power up and is analogous to the SCRs of the commutation modules of FIGS. 20 and 21 described above. During auxiliary commutation, the appropriate SCR is gated on at the same time as a respective commutation IGBT is gated. The SCR remains conducting as the IGBT is gated off and current transfers to the voltage clamp as discussed below.

The voltage clamp 2205 functions similarly to the voltage clamp 2005 and the voltage clamp 2105 described above with respect to FIGS. 20 and 21, except that the voltage clamp 2205 is essentially doubled to accommodate the independent semiconductor devices of the circuit 2200. The doubled voltage clamp 2205 includes a diode 2220, a voltage source or capacitor 2215, a resistance 2225, a diode 2221, a voltage source or capacitor 2216, and a resistance 2226. The capacitor 2215 and the resistance 2225 are connected in parallel to each other and to the output of a first diode bridge (not pictured). Similarly, the capacitor 2216 and the resistance 2226 are connected in parallel to each other and to the output of a second diode bridge (not pictured). The input of the first diode bridge is connected to a first transformer (not pictured). The input of the second diode bridge is connected to a second transformer (not pictured). The capacitor 2215 and the resistance 2225 are further connected on one side of each of the capacitor 2215 and the resistance 2225 to a cathode side of the diode 2220. Similarly, the capacitor 2216 and the resistance 2226 are further connected on one side of each of the capacitor 2216 and the resistance 2226 to a cathode side of the diode 2221. An anode side of the diode 2220 is connected to a terminal of a first commutation module of the circuit 2200 associated with a collector side of a first self-commutating semiconductor switch such as an IGBT 2245. Similarly, an anode side of the diode 2221 is connected to a terminal of a second commutation module of the circuit 2200 associated with a collector side of a second self-commutating semiconductor switch such as an IGBT 2240. The side of each of the capacitor 2215 and the resistance 2225 that is not connected to the diode 2220 is connected to a different terminal of the first commutation module associated with an emitter side of the IGBT 2245. Similarly, the side of each of the capacitor 2216 and the resistance 2226 that is not connected to the diode 2221 is connected to a different terminal of the second commutation module associated with an emitter side of the IGBT 2240. The IGBTs 2240 and 2245 each include a capacitance and a resistance connected to the IGBTs 2240 and 2245 in parallel, respectively. These components function as a snubber as disclosed herein, for example with respect to snubber components of FIG. 4.

In a clamping operation, energy is dissipated through the voltage clamp 2205 when the SCR static switch is commutated off. The SCRs can be commutated off as disclosed herein throughout the specification. For example, when positive current is flowing through the AC static switch from the AC mains, and the appropriate SCR of the static switch is commutated off, current flows through a capacitor 2230, an SCR 2235, and an IGBT 2240 when the commutation is in process. At this time, the commutation IGBT 2240 is on. Current then transfers from the IGBT 2240 path to the appropriate clamp path after a successful commutation of the positive main SCR. Accordingly, current flows through the capacitor 2230, the SCR 2235, the diode 2221, and the capacitor 2216 during a clamping action. After the voltage clamp 2105 current decays to zero, the auxiliary SCRs of the dual SCR pair block are naturally commutated and resume blocking current again. A similar process can occur for negative current and commutation during a negative current flow to the load of circuit 2200.

Accordingly, the embodiments shown and discussed above with respect to FIGS. 20-22 can be used to connect a first silicon-controlled rectifier (SCR), a second SCR, and a commutation module in parallel, connect a load to an operating signal, and passing the operating signal through the SCR to the load. The voltage clamp is charged as one of the first SCR or the second SCR are powered on. A voltage source of the voltage clamp is charged via a bridge diode and a transformer connected to an AC supply, where a current from the transformer charges the voltage source of the voltage clamp. The AC supply can also provide the operating signal to the load. The embodiments can also apply, by the commutation module, a reverse bias voltage to the first SCR to turn off the first SCR and can dissipate energy with a voltage clamp when the first SCR or the second SCR is turned off. The dissipating of energy through the voltage clamp flows from the commutation module and includes, after applying the reverse bias voltage to turn off the first SCR, passing energy through a diode of the voltage clamp and a voltage source of the voltage clamp to the load.

In an illustrative embodiment, any of the operations described herein including a controller can be implemented at least in part as computer-readable instructions stored on a computer-readable medium or memory. Upon execution of the computer-readable instructions by a processor, the computer-readable instructions can cause a computing device to perform the operations.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A device comprising:
   a first silicon-controlled rectifier (SCR);
   a second SCR connected in anti-parallel with the first SCR;
   a commutation module, wherein the commutation module is configured to apply a reverse bias voltage to the first SCR or the second SCR to turn off the first SCR or the second SCR; and
   a voltage clamp configured to dissipate energy when the first SCR or the second SCR are turned off, wherein the voltage clamp is charged as one of the first SCR or the second SCR are powered on,
   wherein the commutation module comprises a first commutation module and a second commutation module;
   wherein the first commutation module comprises a first voltage source, a third SCR, and a first self-commutating semiconductor switch connected in series, and the first commutation module is configured to apply a first reverse bias voltage to the first SCR to turn off the first SCR;
   wherein the second commutation module comprises a second voltage source, a fourth SCR, and a second self-commutating semiconductor switch connected in series, and the second commutation module is configured to apply a second reverse bias voltage to the second SCR to turn off the second SCR; and
   wherein the first SCR, the second SCR, the first commutation module, and the second commutation module are connected in parallel.

2. The device of claim 1, wherein the voltage clamp comprises a first voltage clamp component and a second voltage clamp component, and further wherein:
   the first voltage clamp component is connected in parallel to the first self-commutating semiconductor switch; and
   the second voltage clamp component is connected in parallel to the second self-commutating semiconductor switch.

3. The device of claim 2, wherein:
   the first voltage clamp component comprises a diode, a third voltage source, and a first resistance;
   an anode side of the diode is connected to a collector side of the first self-commutating semiconductor switch;
   the third voltage source and the first resistance are connected in parallel; and
   one side of each of the third voltage source and the first resistance are connected to a cathode side of the diode.

4. The device of claim 1, wherein:
   the first self-commutating semiconductor switch and the second self-commutating semiconductor switch are a self-commutating semiconductor switch pair; and
   the third SCR and the fourth SCR are an SCR pair.

5. The device of claim 4, wherein the voltage clamp is connected in parallel to the self-commutating semiconductor switch pair.

6. The device of claim 5, wherein:
   the voltage clamp comprises a diode, a third voltage source, and a first resistance;
   an anode side of the diode is connected to a collector side of the first self-commutating semiconductor switch;
   the third voltage source and the first resistance are connected in parallel;
   a first side of each of the third voltage source and the first resistance are connected to a cathode side of the diode; and
   a second side of each of the third voltage source and the first resistance are connected to an emitter side of the second self-commutating semiconductor switch.

7. The device of claim 6, wherein the voltage clamp is connected to a diode bridge having an output of the diode bridge connected across the third voltage source and an input of the diode bridge connected to an output of a transformer, and further wherein an input of the transformer is connected to a supply side of the device and a current from the transformer charges the third voltage source of the voltage clamp.

8. The device of claim 5, further comprising a fourth voltage source and a second resistance, both connected in parallel to the self-commutating semiconductor switch pair.

9. A device comprising:
   a first silicon-controlled rectifier (SCR);
   a second SCR connected in anti-parallel with the first SCR;
   a commutation module, wherein the commutation module is configured to apply a reverse bias voltage to the first SCR or the second SCR to turn off the first SCR or the second SCR; and
   a voltage clamp configured to dissipate energy when the first SCR or the second SCR are turned off, wherein the voltage clamp is charged as one of the first SCR or the second SCR are powered on,
   wherein the commutation module is connected in parallel with the first SCR and the second SCR, and further wherein the commutation module comprises:
   a first terminal on a supply side of the device connected to an anode side of a third SCR and a cathode side of a fourth SCR;
   a second terminal on a load side of the device connected to an anode side of a fifth SCR and a cathode side of a sixth SCR;

a third terminal connected to a cathode side of the third SCR, a cathode side of the fifth SCR, and a first side of a self-commutating semiconductor switch;
a fourth terminal connected to an anode side of the fourth SCR, an anode side of the sixth SCR, and a first side of a voltage source; and
a fifth terminal connected to a second side of the self-commutating semiconductor switch and a second side of the voltage source.

10. The device of claim 9, wherein the voltage clamp is connected in parallel to the third SCR and the fourth SCR such that a first end of the voltage clamp is connected to the third terminal and a second end of the voltage clamp is connected to the fourth terminal.

11. The device of claim 10, wherein:
the voltage clamp comprises a diode, a second voltage source, and a first resistance;
an anode side of the diode is connected to the third terminal;
the second voltage source and the first resistance are connected in parallel;
a first side of each of the second voltage source and the first resistance are connected to a cathode side of the diode; and
a second side of each of the second voltage source and the first resistance are connected to the fourth terminal.

12. The device of claim 11, wherein the voltage clamp is connected to a diode bridge having an output of the diode bridge connected across the second voltage source and an input of the diode bridge connected to an output of a transformer, and further wherein an input of the transformer is connected to a supply side of the device and a current from the transformer charges the second voltage source of the voltage clamp.

13. A method comprising:
connecting a first silicon-controlled rectifier (SCR), a second SCR, and a commutation module in parallel;
connecting a load to an operating signal;
passing the operating signal through the SCR to the load, wherein a voltage clamp is charged as one of the first SCR or the second SCR are powered on by charging a voltage source of the voltage clamp via a diode bridge and a transformer connected to an AC supply, wherein a current from the transformer charges the voltage source of the voltage clamp, and wherein the AC supply also provides the operating signal to the load;
applying, by the commutation module, a reverse bias voltage to the first SCR to turn off the first SCR; and
dissipating energy with a voltage clamp when the first SCR or the second SCR is turned off.

14. The method of claim 13, further comprising:
connecting an alternating current (AC) static switch and the commutation module in parallel, wherein the AC static switch comprises the first SCR and the second SCR connected in anti-parallel;
connecting the load to the operating signal through the AC static switch during a normal operating condition, wherein the AC static switch is in a closed position during the normal operating condition;
detecting, by a controller, a voltage sag or voltage swell; and
applying the reverse bias voltage to the first SCR or the second SCR of the AC static switch, wherein the AC static switch is in an open position during at least a portion of the voltage sag or voltage swell, and further wherein the reverse bias voltage turns off the first SCR or the second SCR.

15. The method of claim 14, further comprising:
connecting a regulator module to the output terminal, wherein during the normal operating condition the regulator module is bypassed;
generating, by the regulator module, a correction signal during at least a portion of the voltage sag or voltage swell;
switching the AC static switch to the open position by applying the reverse bias voltage to the AC static switch to turn off the first SCR or the second SCR depending on which of the first SCR or the second SCR is conducting current at a time of said switching the AC static switch to the open position; and
applying the correction signal to the operating signal during at least a portion of the voltage sag or voltage swell, wherein the correction signal is applied when the AC static switch is in the open position such that the regulator module is not bypassed.

16. The method of claim 13, wherein the energy dissipated with the voltage clamp flows from the commutation module.

17. The method of claim 13, wherein the dissipating of energy with the voltage clamp comprises, after applying the reverse bias voltage to turn off the first SCR, passing energy through a diode of the voltage clamp and a voltage source of the voltage clamp to the load.

* * * * *